(12) United States Patent
Deak

(10) Patent No.: US 8,294,577 B2
(45) Date of Patent: Oct. 23, 2012

(54) STRESSED MAGNETORESISTIVE TAMPER DETECTION DEVICES

(75) Inventor: James G. Deak, Eden Prairie, MN (US)

(73) Assignee: NVE Corporation, Eden Prairie, MN (US)

(*) Notice: Subject to any disclaimer, the term of this patent is extended or adjusted under 35 U.S.C. 154(b) by 1262 days.

(21) Appl. No.: 12/075,148

(22) Filed: Mar. 10, 2008

(65) Prior Publication Data

US 2008/0247098 A1    Oct. 9, 2008

Related U.S. Application Data

(60) Provisional application No. 60/906,152, filed on Mar. 9, 2007.

(51) Int. Cl.
| | |
|---|---|
| G08B 13/14 | (2006.01) |
| G08B 21/00 | (2006.01) |
| G01R 1/00 | (2006.01) |
| G11B 5/33 | (2006.01) |

(52) U.S. Cl. .............. 340/568.1; 340/657; 340/540; 324/110; 360/328

(58) Field of Classification Search .............. 340/568.1, 340/540, 657; 324/110; 360/328
See application file for complete search history.

(56) References Cited

U.S. PATENT DOCUMENTS

| | | |
|---|---|---|
| 3,971,916 A | 7/1976 | Moreno |
| 4,401,944 A | 8/1983 | Narimatsu et al. |
| 4,860,351 A | 8/1989 | Weingart |
| 5,117,457 A | 5/1992 | Comerford et al. |
| 5,159,629 A | 10/1992 | Double et al. |
| 5,233,505 A | 8/1993 | Chang et al. |
| 5,602,381 A | 2/1997 | Hoshino et al. |
| 5,675,319 A | 10/1997 | Rivenberg et al. |
| 5,790,670 A | 8/1998 | Bramlett |
| 5,910,774 A | 6/1999 | Capriotti et al. |
| 6,233,339 B1 | 5/2001 | Kawano et al. |
| 6,264,108 B1 | 7/2001 | Baentsch |
| 6,310,549 B1 | 10/2001 | Loftin et al. |

(Continued)

OTHER PUBLICATIONS

Official Search Report of the International Searching Authority in counterpart foreign Application No. PCT/US 08/03142 filed Mar. 10, 2008.

(Continued)

*Primary Examiner* — Brian Zimmerman
*Assistant Examiner* — Omeed Alizada
(74) *Attorney, Agent, or Firm* — Kinney & Lange, P.A.

(57) ABSTRACT

A tamper sensing system mounted with respect to a protected structure so as to have corresponding stress changes occur therein in response to selected kinds of tamperings with said protected structure comprising a first pair of stress affected magnetoresistive memory devices each capable of having a magnetic material layer therein established in a selected one of a pair of alternative magnetization states if in a first kind of stress condition and of being established in a single magnetization state if in an alternative second kind of stress condition, and the magnetic material layer in each having a magnetization in a first direction in one of the pair of alternative magnetization states and in a second direction in that remaining one of the pair of magnetization states. A first magnetizing electrical conductor extends adjacent to each of the first pair of stress affected magnetoresistive memory devices to establish said magnetic material layer in that one of said pair of alternative magnetization states thereof so as to have its said corresponding magnetization be oppositely directed with respect to said magnetization of that other. The first pair of stress affected magnetoresistive memory devices can each be provided by a spin dependent tunneling device having differing numbers of magnetization states available thereto depending on whether being in differing ones of alternative stress conditions.

19 Claims, 15 Drawing Sheets

U.S. PATENT DOCUMENTS

| | | |
|---|---|---|
| 6,462,979 B2 | 10/2002 | Schlosser et al. |
| 6,501,390 B1 | 12/2002 | Chainer et al. |
| 6,592,034 B1 | 7/2003 | Millard et al. |
| 6,753,775 B2 | 6/2004 | Auerbach et al. |
| 6,774,807 B1 | 8/2004 | Lehfeldt et al. |
| 6,778,083 B2 | 8/2004 | Auerbach et al. |
| 6,784,796 B2 | 8/2004 | Johnston et al. |
| 6,891,474 B1 | 5/2005 | Fletcher |
| 2001/0030839 A1 | 10/2001 | Zhong et al. |
| 2001/0033012 A1 | 10/2001 | Kommerling et al. |
| 2003/0048676 A1 | 3/2003 | Daughton et al. |
| 2003/0212871 A1 | 11/2003 | Suzuki et al. |
| 2004/0134994 A1 | 7/2004 | Zaba et al. |
| 2005/0047543 A1 | 3/2005 | Sandstrom |
| 2005/0051624 A1 | 3/2005 | Kipp et al. |
| 2005/0066168 A1 | 3/2005 | Walmsley |
| 2005/0122217 A1 | 6/2005 | Seal et al. |
| 2005/0151777 A1 | 7/2005 | Silverbrook |
| 2006/0092020 A1 | 5/2006 | Wilson et al. |
| 2006/0108668 A1 | 5/2006 | Knudsen |
| 2006/0146597 A1 | 7/2006 | Lenssen et al. |
| 2006/0179490 A1 | 8/2006 | Lenssen et al. |
| 2006/0262585 A1 | 11/2006 | Lenssen |
| 2008/0088996 A1 | 4/2008 | Bonvalot et al. |

OTHER PUBLICATIONS

Extended European Search Report in foreign counterpart Application No. 08742038.6 filed Mar. 10, 2008, dated Mar. 31, 2011.

Untampered Condition

Other components may reside under the shield

Stressed die

Tampered Condition

LATSS irreversibly tripped! Protected system can query the state of the device and respond.

Die stress relieved

STRESSED MAGNETORESISTIVE TAMPER DETECTION DEVICES

CROSS-REFERENCE TO RELATED APPLICATION

This application claims the benefit of Provisional Patent Application No. 60/906,152 filed Mar. 9, 2007 for STRESSED MAGNETORESISTIVE TAMPER DETECTION DEVICES.

BACKGROUND

The present invention is directed towards electrical power source free tamper detection sensors and, more particularly, sensors that detect and record sufficient mechanical change in the packaging of, or other protective enclosure of, items such as integrated circuits or electronic systems to indicate tampering therewith.

The prevention of unauthorized handling, or the removal from rightful custody, of personal, corporate, or military items, components, systems or other entities, or the illicit obtaining of information therefrom or thereabout, particularly expensive electronic goods or electronic devices that contain sensitive data, has become increasingly important. This growing importance of such physical security for those entities against such tampering comes about as the numbers of such entities has grown, and as their economic value and the competitive value of sensitive information often contained therein has also increased. The ongoing trend of storing vast amounts of personal and business data and software in a computer hard disc drive, a portable memory device, or other electronic systems makes theft and tamper prevention all the more important. Computers, personal digital assistants (PDAs), cell phones, portable data storage devices, and smart cards, are increasingly available in the home and in the business place. Military systems increasingly contain sensitive hardware and algorithms that cannot be permitted to fall into the hands of a foreign government, or agents thereof, that might attempt to reverse engineer a critical military system for its own use.

Even larger systems, such as desk-top computers or hardware systems that cannot easily be removed from a home or facility, are also susceptible to theft or compromise: there is a likelihood that valuable information or sensitive information bearing internal components such as non-volatile memory chips, computer hard drives, programmable gate arrays, or application specific integrated circuits may be removed after the exterior cover thereof has been removed. Most such thefts are never solved, and the property is rarely recovered. Therefore there is a need to protect certain entities, such as a computer or other electronic systems, from being opened to remove sensitive components or to recover valuable data including but not limited to security encryption keys and computer algorithms.

Tamper protection for systems falls into at least three categories; tamper-evident packaging; packaging that is difficult to remove without destroying the protected device; and sensors to detect intrusion to allow a system to erase sensitive data or to destroy critical hardware in the event of tampering. Tamper-evident packaging schemes are limited to low cost devices or low importance data, and do not provide any protection in the situation in which an entire system can be stolen. Anti-tamper coatings or housings that are difficult to remove without destroying the components contained within the housing also do not protect data stored within the enclosure as the data can be recovered from damaged components. Sensors that allow a system to destroy critical data or disable critical components often need electrical power such as from a battery in order to operate. Different types of sensors, including switches to mechanically detect the removal of a lid, optical sensors to detect light, and fabrics containing wires that must be cut to access a component, always require electronics hardware that must be electrically powered to record the tamper event. There is thus a security risk in that a clever tamperer, such as a person skilled in "reverse engineering" or "hacking", may disable the sensor before the system records the tamper event and responds. There is thus a need for a tampering sensor that can record a tamper event in the absence of applied electrical power. Such a sensor is often made even more useful if it can destroy critical data, such as, but not limited to, an encryption key, in the absence of applied power.

SUMMARY

The present invention provides a tamper sensing system mounted with respect to a protected structure so as to have corresponding stress changes occur therein in response to selected kinds of tamperings with said protected structure comprising a first pair of stress affected magnetoresistive memory devices each capable of having a magnetic material layer therein established in a selected one of a pair of alternative magnetization states if in a first kind of stress condition and of being established in a remaining magnetization state if in an alternative second kind of stress condition, and the magnetic material layer in each having a magnetization in a first direction in one of the pair of alternative magnetization states and in a second direction in that remaining one of the pair of magnetization states, the first pair of stress affected magnetoresistive memory devices being mounted together such that at least one of the first and second directions thereof at least in part parallels an aligning direction that parallels at least in part at least one of said first and second directions of that other one remaining. A first magnetizing electrical conductor extends adjacent to each of the first pair of stress affected magnetoresistive memory devices such that providing an electrical current therethrough to generate a corresponding magnetic field thereabout establishes said magnetic material layer thereof in that one of its pair of alternative magnetization states so as to have its corresponding magnetization thereof be oppositely directed with respect to said magnetization of that other magnetic material layer insofar as components thereof substantially parallel to said aligning direction when each of the first pair of stress affected magnetoresistive memory devices are provided with a first kind of stress condition.

The first pair of stress affected magnetoresistive memory devices can each be provided by a spin dependent tunneling device having differing numbers of magnetization states available thereto depending on whether being in differing ones of alternative stress conditions. Such a spin dependent tunneling device has an electrically insulative material intermediate layer with two major surfaces on opposite sides thereof, and both a magnetization reference layer on one of said intermediate layer major surfaces a relatively fixed direction of magnetization and a memory film of an a magnetostrictive, anisotropic ferromagnetic material on that remaining one of the intermediate layer major surfaces having a magnetization directed at an angle with respect to said relatively fixed direction due to an effective magnetic bias field being present to result in said device having an electrical resistance versus applied external magnetic field characteristic in a first kind of stress conditions with unequal coercivities for external magnetic fields applied in opposite directions. The magnetostrictive, anisotropic ferromagnetic material is such that the device in one kind of stress conditions has a coercivity with a magnitude exceeding that of the effective magnetic bias field and in another kind of stress conditions has no coercivity with a magnitude exceeding that of the effective magnetic bias field.

DETAILED DESCRIPTION

Figure 1A:
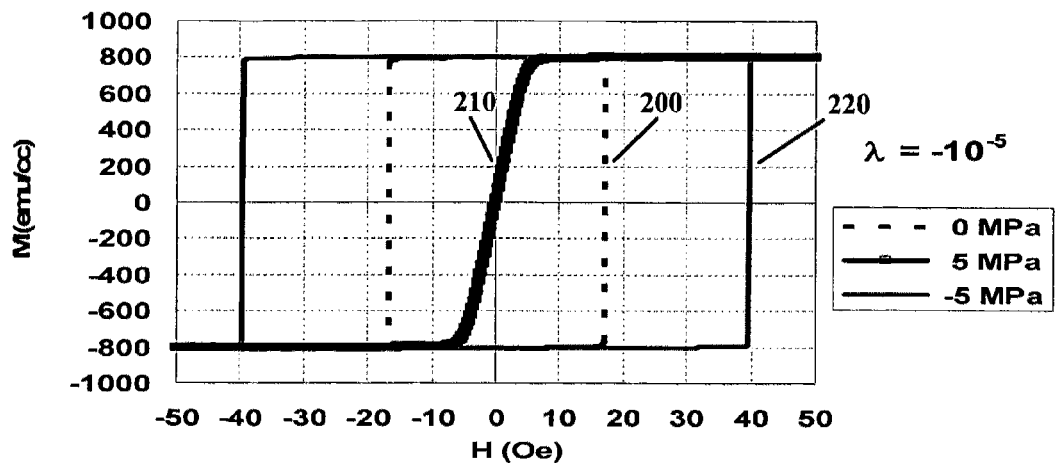
FIGS. 1A and 1B show graphs with plots of magnetoresistance versus magnetic field for ferromagnetic films.

A latching anti-tampering stress based sensor (LATSS) apparatus, and methods for employing same, is useable to provide tamper protection for a protected arrangement through detecting and recording the occurrence of a physical intrusion into that arrangement such as a housing for that device or an encapsulated electronic assembly or the like. LATSS devices are stress sensors operated without supplying electrical power thereto during the time they are used to monitor whether an unacceptable degree of stress has been applied to the protective barrier enclosing the items that the LATSS devices are intended to protect with such monitoring, whether through attempted or actual movement thereof or otherwise, such monitoring beginning after those devices have been electronically set to a monitoring state, i.e., initialized. Once initialized, a LATSS will detect and record whether a significant change in some mechanical aspect of the protective barrier has ever occurred since initialization, and it will then be capable of providing a digital signal that will permanently latch the device into a tamper detected state. The mechanical change will be detected by the sensor as a change in stress occurring in its substrate, which for a properly positioned sensor will result from the removal (and possibly replacement) of a cover that protects an critical electronics system, the removal (and possibly replacement) of a PC board from a rack, or removal of a potting compound, or the like. Once such a mechanical change has been detected, a LATSS device cannot be reset.

The sensor elements of the LATSS devices herein are based on spin-dependent tunneling (SDT) junctions utilizing magnetostrictive ferromagnetic free layers. SDT junctions are advantageous in that they are compatible with standard semiconductor processing, thereby allowing low cost device fabrication of them. In addition, they are intrinsically radiation hard, permitting the development of radiation hard antitamper (AT) sensors. Magnetostrictive SDT junctions provide an effective combination of capabilities for an AT sensor. The hysteretic magnetic behavior of the SDT electrodes provides the capability for the magnetization of a LATSS device to irreversibly latch into a state indicating the protective barrier has been breached, even in the absence of applied power. The combination of magnetoresistance and magnetostriction together provide for a small, highly sensitive, stress-to-resistance transducer. Here, the magnetoresistance of the SDT junctions permits resistive readout of the orientation of the magnetizations of the ferromagnetic sensor layers, and the magnetostrictive effect couples the magnetization orientation to the stress in the sensor substrate. Magnetic hysteresis allows the devices to irreversibly change the electrical resistance therethrough when the stress on the sensor substrate passes a selected threshold.

Magnetostriction can be described as a change in dimensions, or strain, exhibited by ferromagnetic materials when they are subjected to a magnetic field. Magnetostrictive ferromagnetic materials also exhibit an inverse effect, known as a magnetomechanical effect, that is, a change in their magnetic behavior as a function of applied stress. The present invention is directed towards passive tamper-detection sensors that couple this stress sensitivity of magnetostrictive materials with the magnetoresistive effect in order to provide a latching stress sensor that will latch into one of two alternative magnetic states to allow a digital readout. For the purpose of the LATSS device disclosed herein, a mathematical description of the latching response of a magnetostrictive sensor element to an applied stress is provided below. This involves showing the dependence of the switching field ($H_c$) of the sensor on applied stress ($\sigma$) in addition to numerical simulation of the magnetic state of the sensor as a function of increasing $\sigma$.

The stress-strain relationship for a thin-film (f) plated onto a thick cantilever beam substrate (s), that is, a thin-film (f) on a thick substrate (s), is described by the following expression known as Stoney's formula, $$\sigma_f = \frac{1}{6C} \cdot \frac{E_s d_s^2}{(1-v_s)d_f}, \quad (1)$$

where $E_s$ is the Young's modulus of the substrate, $d_s$ the substrate thickness, C the bending radius of the substrate, $v_s$ the Poisson ratio of the substrate, $\sigma_f$ the film stress, and $d_f$ the film thickness. Stoney's formula provides a convenient way to measure the stress of a thin-film on a thick substrate with just measuring the bending radius, which is easier to measure than is stress directly.

The magnetomechanical effect can be described in terms of a magnetic anisotropy field $H_s$ induced by stress or strain that may be expressed as $$H_s = \frac{3\sigma_f \lambda}{M_s}, \quad (2)$$

or as an anisotropy constant as $$K_s = \frac{3\sigma_f \lambda}{2}. \quad (3)$$

Here, $M_s$ is the saturation magnetization and $\lambda=\Delta L/L$ is the magnetostriction constant, which refers to the change in length $\Delta L$ of a ferromagnetic object relative to the object's length L at a zero applied magnetic field as the result of a magnetic field large enough to saturate the ferromagnetic object being applied.

The stress-induced anisotropy, $K_s$, changes the coercivity of the ferromagnetic object. To predict the change in the coercivity, $H_c$, of a micron-sized patterned magnetostrictive ferromagnetic film as a function of $\sigma$, the stress anisotropy relation in equation 3 may be added to the Stoner-Wohlfarth description of the coercivity of a ferromagnetic object to yield $$E(\theta) = -H_x M_s \cos(\theta) - H_y M_s \sin(\theta) + K_A \sin^2(\theta - \theta_A) + \quad (4)$$
$$\frac{N_x M_s^2}{2}\cos^2(\theta) + \frac{N_y M_s^2}{2}\sin^2(\theta) + K_S \sin^2(\theta - \theta_S).$$

Here, E is the magnetostatic energy of the patterned magnetic film, $N_x$ and $N_y$ are the demagnetizing factors in the x and y directions in the plane of the film, $H_x$ and $H_y$ the fields applied along the x and y directions, and $K_A$ is the material's intrinsic anisotropy constant. Note also that $\theta$ is the angle of $M_s$ with respect to the x-axis, $\theta_A$ is the angle of the ferromagnetic material's intrinsic easy-axis with respect to the x-axis, and $\theta_S$ is the axis along which stress $\sigma$ is applied.

Assuming stress $\sigma$ and the magnetic field are applied along the easy axis (x-axis), the field $H_c$ where the magnetization as a result irreversibly flips into the opposite direction in these circumstances can be found by taking the first and second derivative of equation 4 with respect to $\theta$, and solving the resulting system of equations, $dE/d\theta=0$ and $d^2E/d\theta^2=0$, for $H_x=H_c$. This procedure yields the following dependence of $H_c$ on $\sigma$ $$H_c(\sigma_c) = \frac{2\left\{K_A + \frac{3\sigma_f \lambda}{2} + \mu_0 M_s^2(N_y - N_x)\right\}}{M_s} \quad (5)$$

This equation is inverted to find the critical stress, $\sigma_c$, that is required to reverse the magnetization direction in the film. If an external field $H_x<H_c$ is applied, the difference between $H_x$ and $H_c$ represents the anisotropy field that must be overcome by the applied stress. Thus, substituting $H_c-H_x$ for $H_c$ in this equation and inverting for $\sigma_f=\sigma_c$, provides a definition for the critical stress for reversal $$\sigma_c = \frac{M_s(H_c - H_x) - 2\{K_A + \mu_0 M_s^2(N_y - N_x)\}}{3\lambda}. \quad (6)$$

Clearly, $\sigma_c$ can be increased or decreased by the application of a magnetic field. The magnetostriction coefficient, $\lambda$, may be positive or negative depending on the kind of ferromagnetic material used in the film, which allows much freedom in configuring the stress response of a LATSS device. For positive $\lambda$, compressive (−) stress along the easy-axis reduces $H_c$ while tensile stress increases $H_c$. For negative $\lambda$, compressive (−) stress applied along the easy-axis increases $H_c$ while tensile stress reduces $H_c$. The effect of arbitrary orientation of $\sigma$ and applied fields, rather than just along the easy axis as in the example above, may be simulated numerically by minimization of equation 4.

Figure 1B:
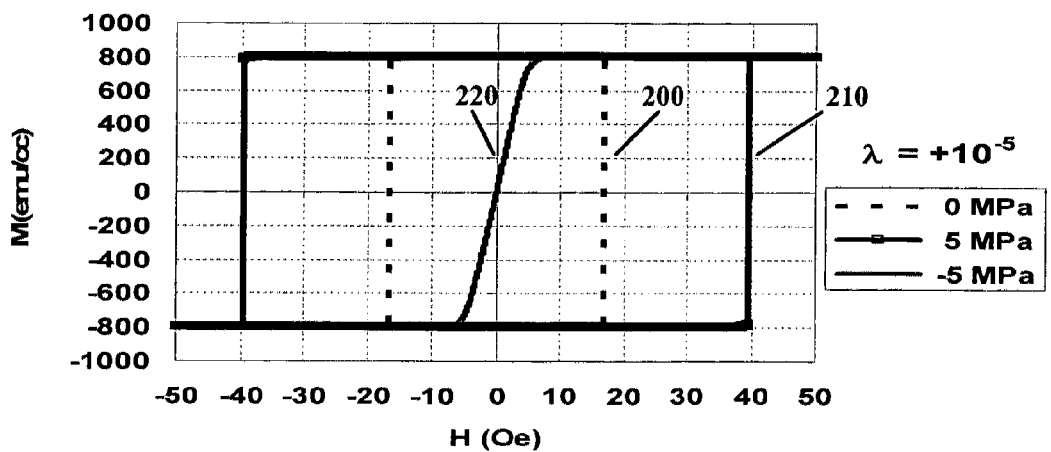

The basic dependence for $\lambda<0$ and $\lambda>0$ with $\sigma$ applied along the easy-axis of a patterned ferromagnetic film is shown in FIGS. 1A and 1B. Shown there are the results of a simulation of the effects of no stress, 200, tensile stress, 220, and compressive stress, 210, on 3 μm by 1.5 μm by 5 nm thick elliptical patterned ferromagnetic films. The result for a negative magnetostriction coefficient of $\lambda=-10^{-5}$ is shown in FIG. 1A and for a positive magnetostriction coefficient of $\lambda=10^{-5}$ in FIG. 1B. The magnetic field is applied along the easy-axis and parallel to the stress. Note that the combination of stress and the polarity of the magnetostriction coefficient may be used to increase or reduce the coercive force $H_c$.

Exemplary magnetostrictive materials include alloys of Ni, Fe, Co with the possible addition of other elements including but not limited to Tb, Dy, Ga, Al, B. Hf, and Pd. The magnetostriction of various ferromagnetic materials is given in Table 1. The values given in Table 1 are only approximate. The actual values may differ dependent on material microstructure, film thickness, etc.

TABLE 1

| Material | Saturation Magnetostriction (ppm) |
|---|---|
| Fe | 7.5 |
| Ni | −35 |
| Alfenol 13 | 40 |
| Galfenol | 400 |
| Terfenol-D | 4000 |
| $Co_{70}Fe_{30}$ | 130 |
| $Ni_{45}Fe_{55}$ | 30 |
| $Ni_{80}Fe_{20}$ | 2 |
| $Ni_{90}Fe_{10}$ | −12 |

Figure 2:
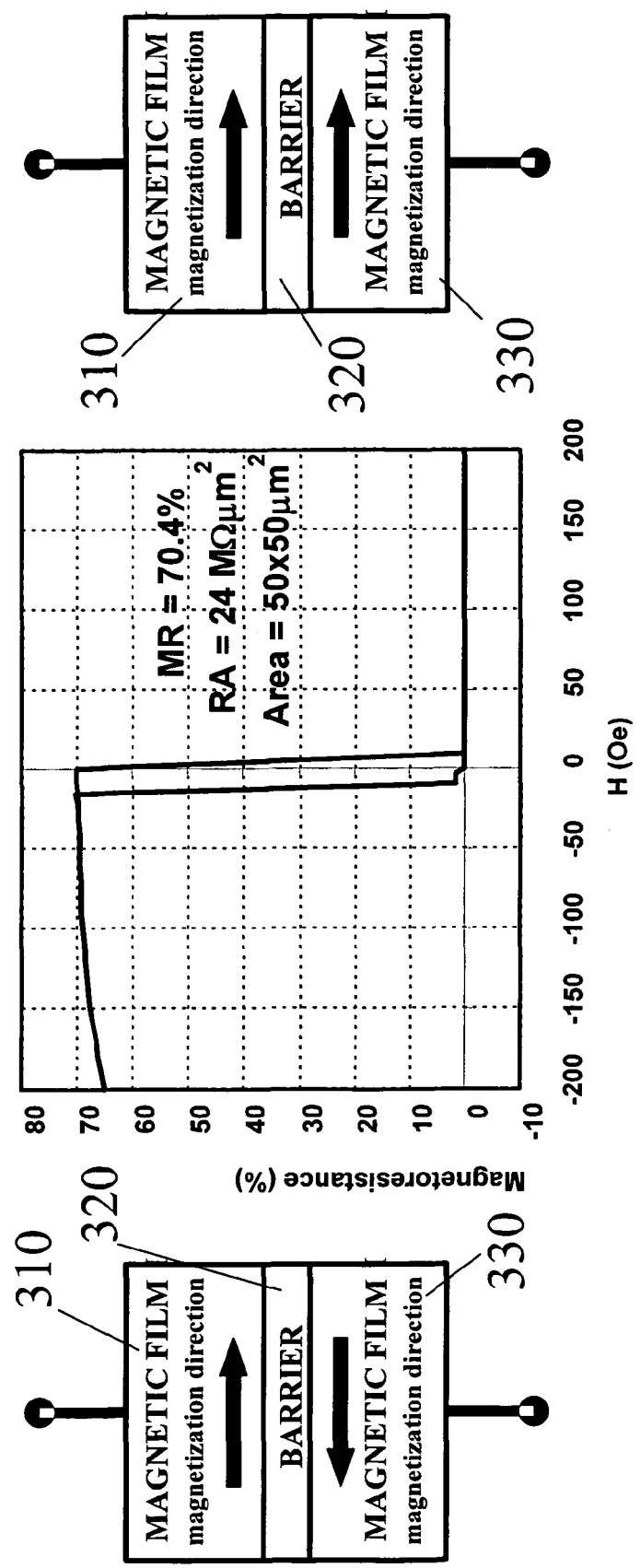
FIG. 2 shows schematic representations of a spin dependent tunneling device and a representation of a magnetoresistance versus externally applied magnetic fields characteristic therefor.
Figure 3:
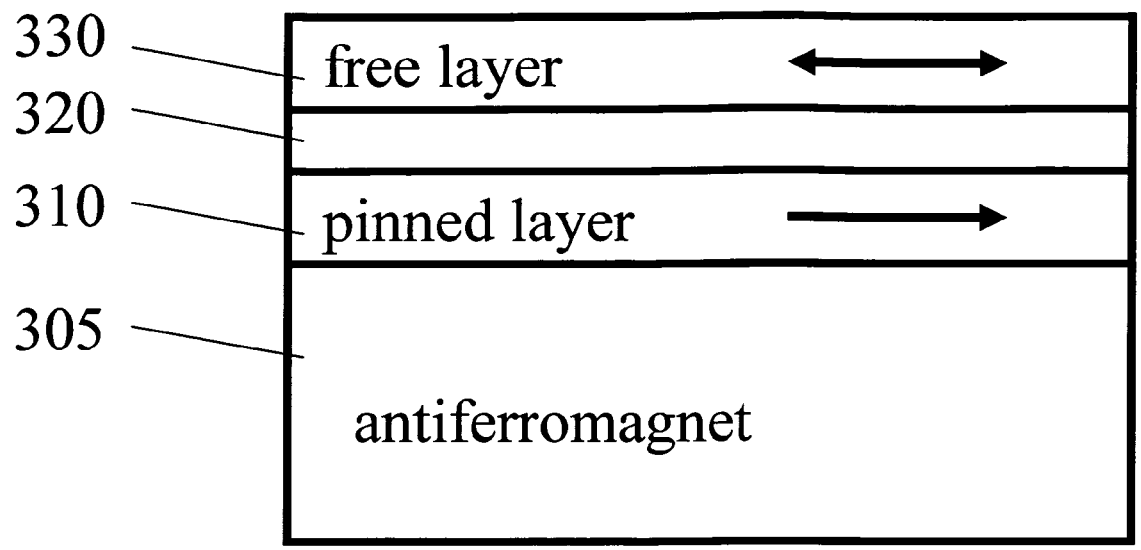
FIG. 3 shows schematic representations of a spin dependent tunneling device having a fixed magnetization layer.

Spin dependent tunneling (SDT) devices provide a simple means for determining the magnetic state of a magnetostrictive ferromagnetic thin-film used as a free layer therein. A SDT device minimally comprises two planar ferromagnetic thin-films, a free layer and a pinned magnetization direction layer, that are separated by a thin insulating tunneling barrier, as represented schematically in FIGS. 2 and 3, and with the magnetoresistance versus externally applied magnetic field data from such a SDT device also being shown in FIG. 2. The applied field is provided parallel to the pinned direction shown in FIGS. 2 and 3. Tunneling magnetoresistance (TMR) is defined as the maximum change in device electrical resistance divided by the device minimum resistance. The minimum resistance occurs when the magnetizations of both magnetic layers are parallel, and the maximum resistance when the magnetizations of the two layers are oriented anti-parallel to one another. The offset, 300, in the loops plot is due to Néel coupling between the pinned and free layers. A typical layered structure of a SDT device with a top-pinned ferromagnetic film is schematically represented in FIG. 3. The free layer 330 and pinned layer ferromagnet 310 are typically composed of CoFeB or NiFeCo. The tunnel barrier 310 is usually either $Al_2O_3$ or MgO. The antiferromagnet 305, used to set the orientation of the pinned layer ferromagnet, is typically of IrMn or CrPtMn.

The insulating barrier, although commonly composed of $Al_2O_3$ or MgO, the fabrication thereof need not be limited to these insulating materials. The ferromagnetic layers are usually alloys of Ni, Fe, and Co and are often alloyed also with non-ferromagnetic materials like B, Cr, Zr, Al, Mo, and Ta, but need not be restricted to these materials. One ferromagnetic layer, as the free layer, has a magnetization that is free to rotate in response to an applied magnetic field. The other ferromagnetic layer, as the pinned layer, has a magnetization that is not free to respond to magnetic fields of magnitudes at which the free layer begins to respond. The pinning is accomplished either with a single antiferromagnetic pinning layer, such as FeMn or IrMn (see FIG. 3) exchange coupled to a ferromagnetic layer, or through the use of a high coercivity ferromagnetic layer. The orientation of the free layer's magnetization relative to the pinned layer's magnetization determines the electrical resistance through the SDT device, and serves as a probe of the stress in the free layer if the free layer is composed of a magnetostrictive material.

Electrical conduction through a SDT device is of a different nature from that of an anisotropic magnetoresistance (AMR) formed of a single ferromagnetic layer or common giant magnetoresistive (GMR) effect of a ferromagnet—normal metal—ferromagnet structure, in which the electrical current flows parallel to the plane of the substrate. Electrical conduction through a SDT device is similar to that of a vertical giant magnetoresistance (VGMR) device insofar as the current flows instead perpendicular to the plane of the substrate. In both the VGMR and SDT arrangements, the resistance of the devices is proportional to the cosine of the angle between the magnetizations of the two ferromagnetic films. The magnetoresistance is a minimum when the magnetizations of the two magnetic layers are parallel and greatest when they are anti-parallel. In the VGMR effect, this field-varying portion of the resistance typically represents an increase from the nominal (magnetizations parallel) resistance on the order of 1%, whereas in SDT junctions it represents 20-70% for $Al_2O_3$ and can approach 400% for SDT devices utilizing an MgO barrier.

Due to the perpendicular to the substrate direction of the electrical conduction therein, the resistance of VGMR and SDT devices decreases with increasing planar areas of the devices. In contrast to VGMR elements, however, the SDT junction "resistance-area product" (RA) can be adjusted over many orders of magnitude by controlling the tunneling barrier thickness. SDT materials thus provide great flexibility in that they can be deposited on silicon wafers with RA ranging from 0.05 MΩ-μm² to 10,000 MΩ-μm². The improved control over cell resistance and improved magnetoresistance of SDT devices allow for a large cell signal and optimal matching with peripheral sensing circuitry.

Figure 4:
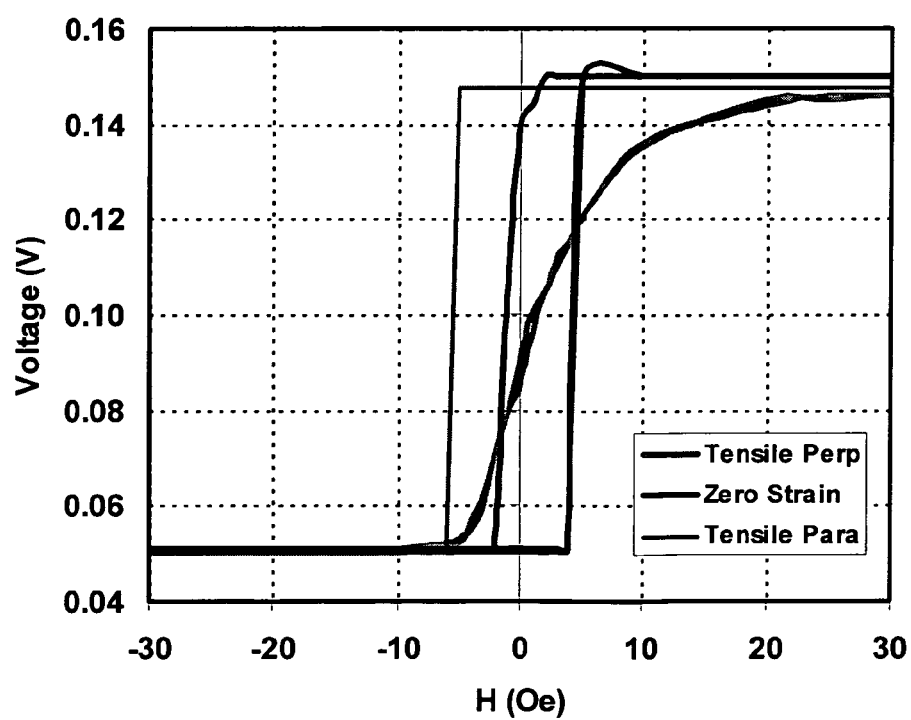
FIG. 4 shows a graph with plots of magnetoresistance versus magnetic field for a stressed spin dependent tunneling device.

The results of measuring of the effect of stress on the magnetoresistive hysteresis loop [R(H)] of a SDT junction using a CoFeB as free layer is shown in FIG. 4. Voltage values representing resistance values in three TMR traces for the SDT conducting a constant measurement basis electrical current therethrough are each provided for the SDT being under one of three corresponding stress conditions. The SDT sample is formed as a Si(100)—$Si_3N_4$—Ru—CoFeB—Ta—CoFeB—$Al_2O_3$—CoFeB—Ru—FeCo—CrMnPt SDT junction pair after annealing at 250° C. for one hour.

CoFeB has a positive λ=30 ppm; thus, when a large tensile stress is applied, CoFeB develops an easy axis in the direction parallel to a tensile stress. In the situation shown in FIG. 4, when tensile stress is applied perpendicular to the applied field direction of the zero-stress easy-axis R(H) loop, it transforms into a hard axis R(H) loop, that is it becomes linear and closed. This means that the intrinsic magnetic anisotropy of the free magnetic layer with no strain becomes small compared to the stress-induced anisotropy. When a tensile stress is applied parallel to the applied field direction of the zero-stress easy-axis R(H) loop, the coercivity increases and the R(H) loops become more square. The easy-axis coercivity is thus enhanced because the stress-induced anisotropy then adds to the material anisotropy. This experiment compares well with the simulated results for positive magnetostriction in FIG. 1B.

Figure 5A:
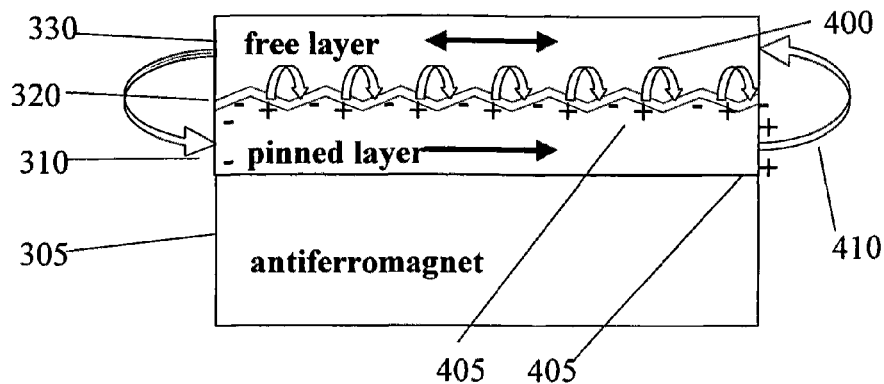
FIGS. 5A, 5B and 5C show schematic representations of spin dependent tunneling device interlayer magnetic coupling and auxiliary magnetic couplings.

The magnetic behavior of the free layer in a SDT junction is altered by the presence of the pinned layer. In a typical SDT device material layers stack shown in FIG. 3, free ferromagnetic layer 330 tends to show an offset due to magnetic coupling thereof to pinned layer 310. This magnetic coupling is a result of the stray magnetic field emanating from the edges of the pinned layer and also due to an exchange coupling through the non-magnetic layer separating the free and pinned layers. These coupling fields are illustrated in a corresponding layered magnetic structure in FIG. 5A showing the coupling fields 400 and 410 between pinned layer 310 and free ferromagnetic layer 330, and they are a result of free magnetic charges 405 at the pinned-layer 310/tunnel barrier 320 interface, $H_{coup}$ 400, and those that exist at the edges of the pinned layer, $H_{stray}$ 410. Free magnetic charges 405 form due to the roughness of the tunnel barrier/pinned layer interface and the edges of the pinned layer. The field 400 due to the interface roughness is called Néel coupling, and it tends to favor parallel alignment of the free and pinned layer magnetizations. The stray field coupling 410 tends to favor anti-parallel alignment of the free and pinned layer magnetizations.

The stray field coupling, $H_{stray}$ 410, decreases with increasing bit size, decreasing pinned layer thickness, and decreasing pinned layer saturation magnetization. The magnetic exchange coupling (Néel coupling, $H_{coup}$ 400) between the two magnetic electrodes in these SDT devices can be controlled through the roughness of the seed layer, the thickness of the barrier, and the kinds of ferromagnetic materials used. The dependence of $H_{coup}$ 400 on the magnetic and physical properties of the SDT junction is described by the well-known equation for Neel coupling, $$H_{coup} = \frac{\pi^2 h^2 M_P}{\sqrt{2}\,\Gamma d_f} \exp\left(\frac{-2\pi\sqrt{2}\,t_b}{\Gamma}\right) \quad (7)$$

Here, $M_P$ is the pinned layer magnetization, $d_f$ is the free layer thickness, $t_b$ the tunnel barrier of thickness, $\Gamma$ the roughness wavelength, and h the roughness amplitude. The magnitude of the coupling can easily be varied from 1 to 20 Oe. The competition between $H_{coup}$ 400 and $H_{stray}$ 410 can be used to control the offset of the freelayer hysteresis loop. Generally, SDT devices, having free layer 330 and pinned layers 310 composed of alloys of Ni, Fe, and Co with a thickness on the order of 1 to 20 nm and patterned with dimension much less than 1 µm, will be dominated by $H_{stray}$ 410, while those larger than 1 µm will be dominated by $H_{coup}$ 400.

Figure 5B:
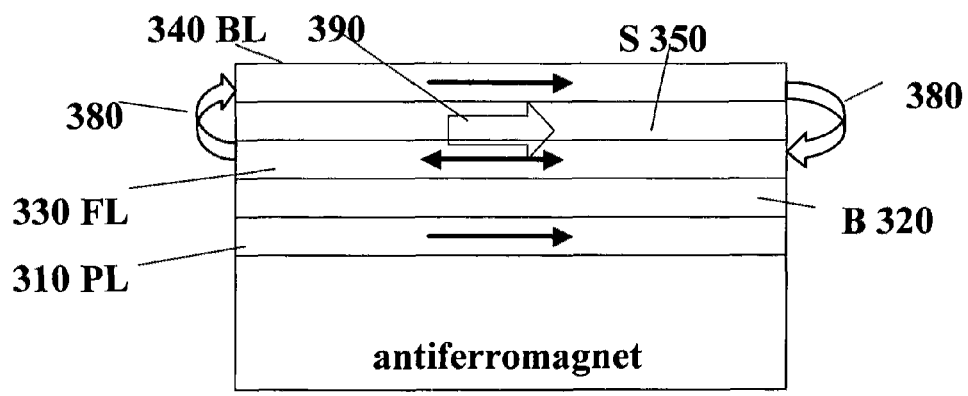

The bias or offset field may also be produced by the addition of other magnetic components layers due to either being provided with the semiconductor die or external thereto. One possibility is shown in FIG. 5B. Here, a spacer layer (S) 350 and bias layer (BL) 340 are added to the stack. BL 340 is to have its magnetic moment pinned. This can be accomplished by adding an additional antiferromagnet adjacent to BL 340. The BL 340 can offset the hysteresis loop of the freelayer (FL) 330 by two possible means. One method would be to use the stray field 380 emanating from the edges of the BL. In this case, the S layer 350 can be a thick metal layer or an additional tunnel junction. Alternatively, the S layer could be composed of a thin metal such as Cu. In this case, RKKY exchange coupling could be used to produce a bias field 390 parallel to the moment of BL 340.

Figure 5C:
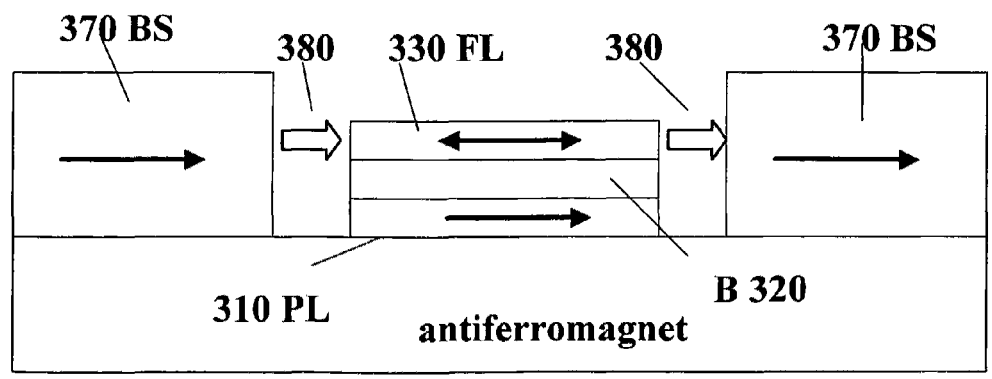

Yet another technique for producing the bias or offset field would be to add bias structures (BS) 370 adjacent to the LATSS element. This is illustrated in FIG. 5C. In this case, the BS devices 370 could either be composed of a high coercivity ferromagnet or they could be a ferromagnet that is pinned by an antiferromagnet. These bias structures would be used to produce a stray field 380 that offsets the hysteresis of the LATSS element's FL 330.

Figure 6A:
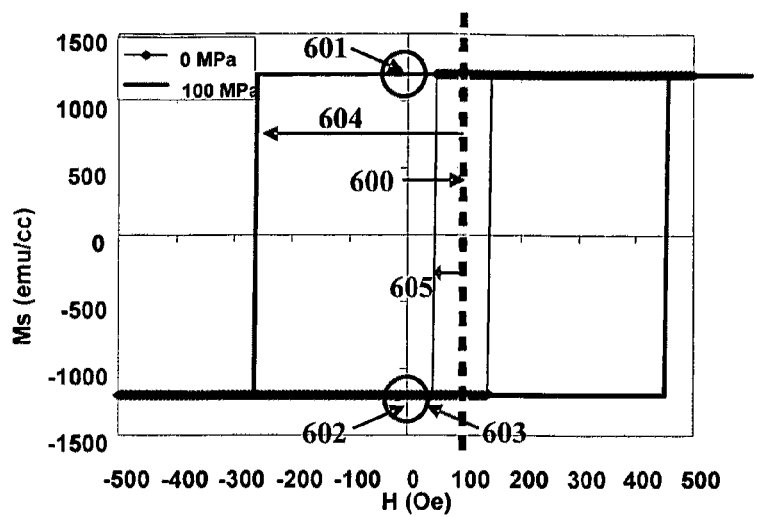
FIGS. 6A, 6B and 6C show graphs with plots indicating the effects of stress on magnetization states of a patterned ferromagnetic film.
Figure 6B:
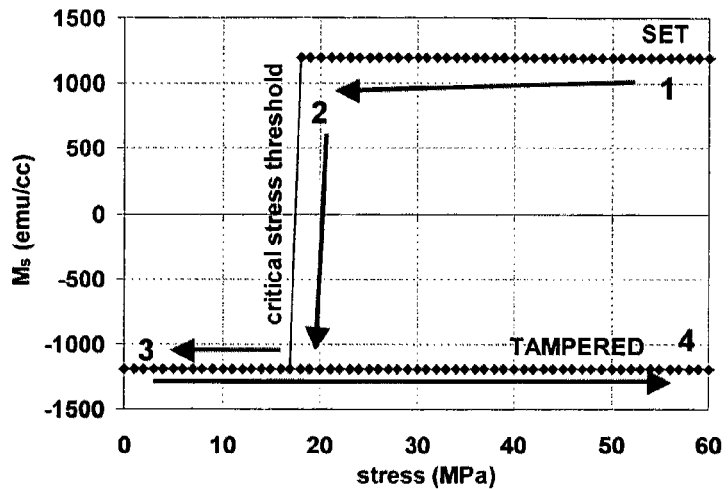

The stress dependent switching behavior of a magnetostrictive SDT element in the presence of a small bias field 600, as might be produced by one of the device arrangements shown in FIG. 5, is the basis on which the LATSS devices will operate. The graphs of FIG. 6A show the magnetization response to an applied magnetic field at 0 (inner loop) and 100 (outer loop) MPa of applied tensile stress. Note the M(H) loops are offset from zero field, typically through one of various methods for providing bias field 600 described in, but not limited to those in, FIG. 5. That is, the bias field is built into the device using one of these various techniques, including roughness dependent Néel coupling between the pinned and free layer or the addition of bias structures. The bias field 600 must have sufficient magnitude such that the stressed state has two stable remanent values 601 and 602, and the unstressed state only has one possible remanent value 603. Alternatively, the bias field 600 must be less then the coercivity of the LATSS element under one stress condition 604 and greater than the coercivity in the other stress condition 605. FIG. 6B shows a simulation of the effect of stress on the magnetic behavior of the LATSS element. The sequence of events is as follows:

1) The film is stressed at 60 MPa and a magnetic field is applied to set the magnetization into the positive direction. A magnetic field in excess of 350 Oe is applied and then removed to set the freelayer of the LATSS element in a preferred magnetic state. This is the "SET" condition.
2) If stress is removed from the substrate, the LATSS free layer coercivity will decrease from 350 Oe to 50 Oe. At some critical value of the applied stress, the coercivity falls below the bias field's magnitude 600, and the magnetization irreversibly changes direction. This is defined as the "TAMPERED" state.
3) At zero applied stress, the LATSS is in the reversed magnetization TAMPERED state.
4) If the stress is reapplied, the magnetization stays in the low state indicating tampering has occurred. This is the "TAMPERED" state.

Figure 6C:
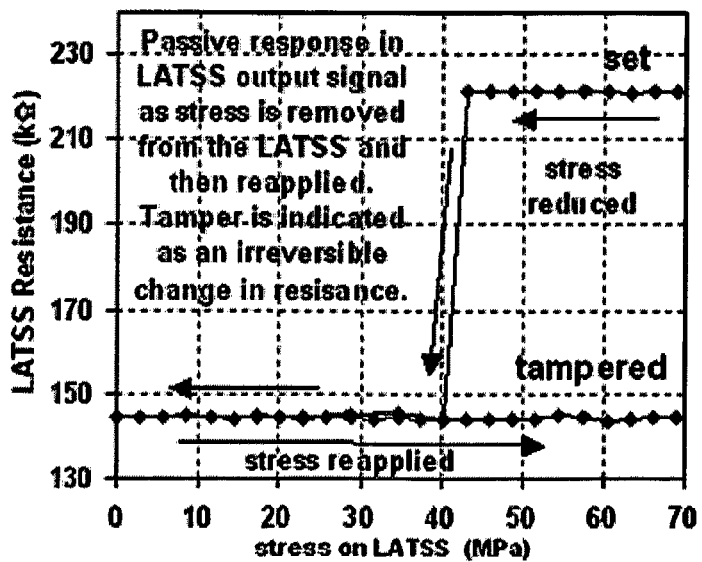
Figure 7:
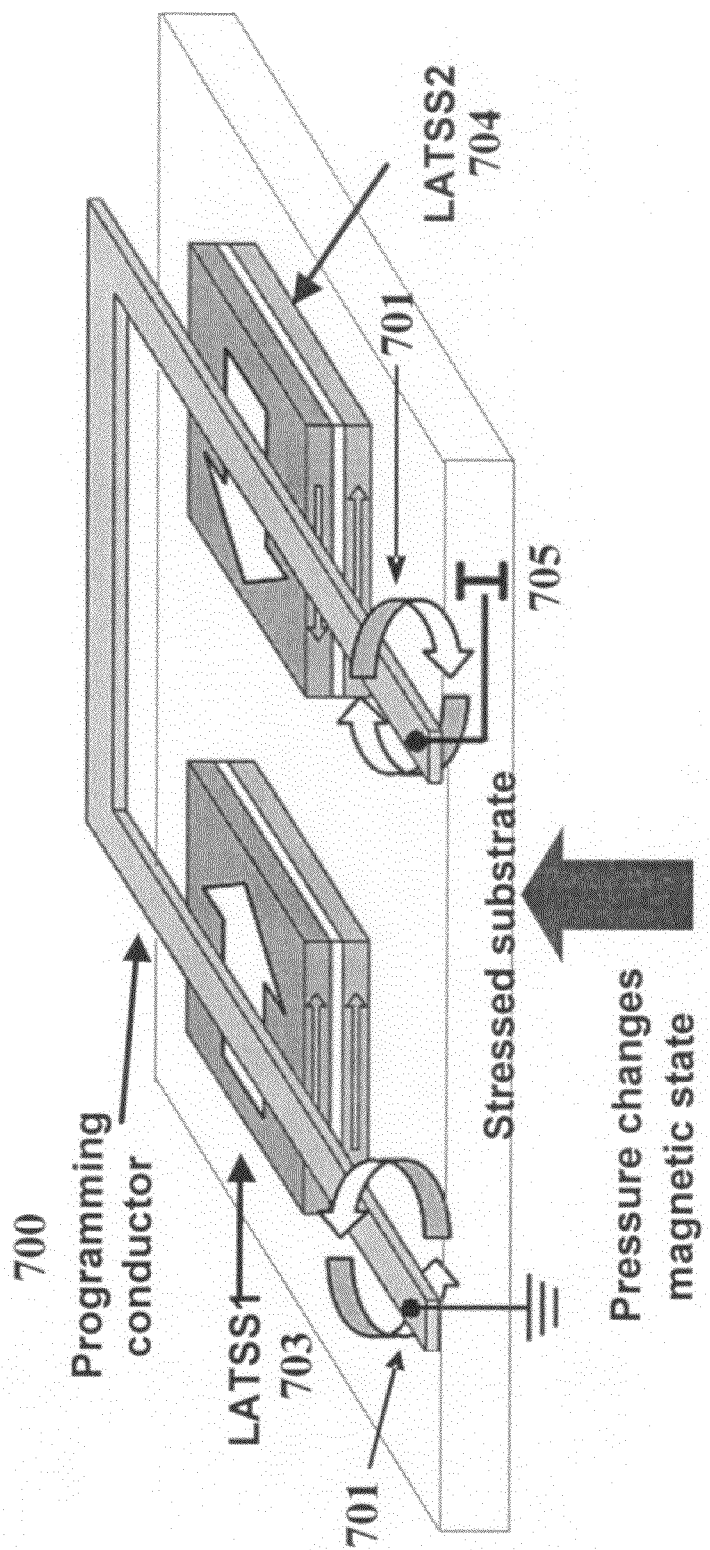
FIG. 7 shows a schematic representation of a two LATSS element die and the arrangement of the programming conductor used to initialize the device into selected magnetization states.

The output of the device is indicated by the resistance measured across the tunnel barrier. Resistance data measured as a function of stress on a LATSS element prototype is shown in FIG. 6C The configuration for which FIG. 6C is provided indicates a low resistance when tampering occurs.

The LATSS element can be designed to signal a tamper event during operation in response to either tensile or compressive stress by varying the geometry of the LATSS elements and/or orientation of the applied stress. There are three important axes in a LATSS sensor that may be oriented to achieve a desired sensor response. These are the intrinsic (zero applied stress) easy-axis of the free layer, the direction of the bias magnetic field, and the direction of an applied stress.

The intrinsic easy-axis is due to the magnetic anisotropy of the SDT junction free layer in zero applied stress. This anisotropy is due in part to the anisotropy of the ferromagnetic material from which the free layer is composed, and in part due to the shape of the free layer. Generally the easy-axis would be set parallel to bias and reset fields, but there may be some advantage in terms of the micromagnetic state that results in the LATSS freelayer in rotating it away from the direction of the set or bias fields. Generally, the switching response can be shown to be more reproducible and the switching field can be reduced if the field is not perfectly aligned with the intrinsic easy-axis of the freelayer. Also, the device could rely solely on the stress-induced anisotropy to hold the initially predetermined SET state stable. In this case, the orientation of the intrinsic easy-axis may be changed in order to find an optimal orientation for robust device operation. In any case, an easy axis may be induced in the material by deposition, including sputtering, evaporation, and electroplating, in an applied magnetic field, or annealing the ferromagnetic materials in the presence of an applied magnetic field may induce it. Alternative techniques, including but not limited to irradiation, annealing, or deposition in the presence of applied stress may also be used. The intrinsic easy-axis is also controlled by the shape into which the free layer is patterned. If the shape is patterned so that one axis is longer than the other, then the magnetization will tend to align along the long axis.

Figure 8:
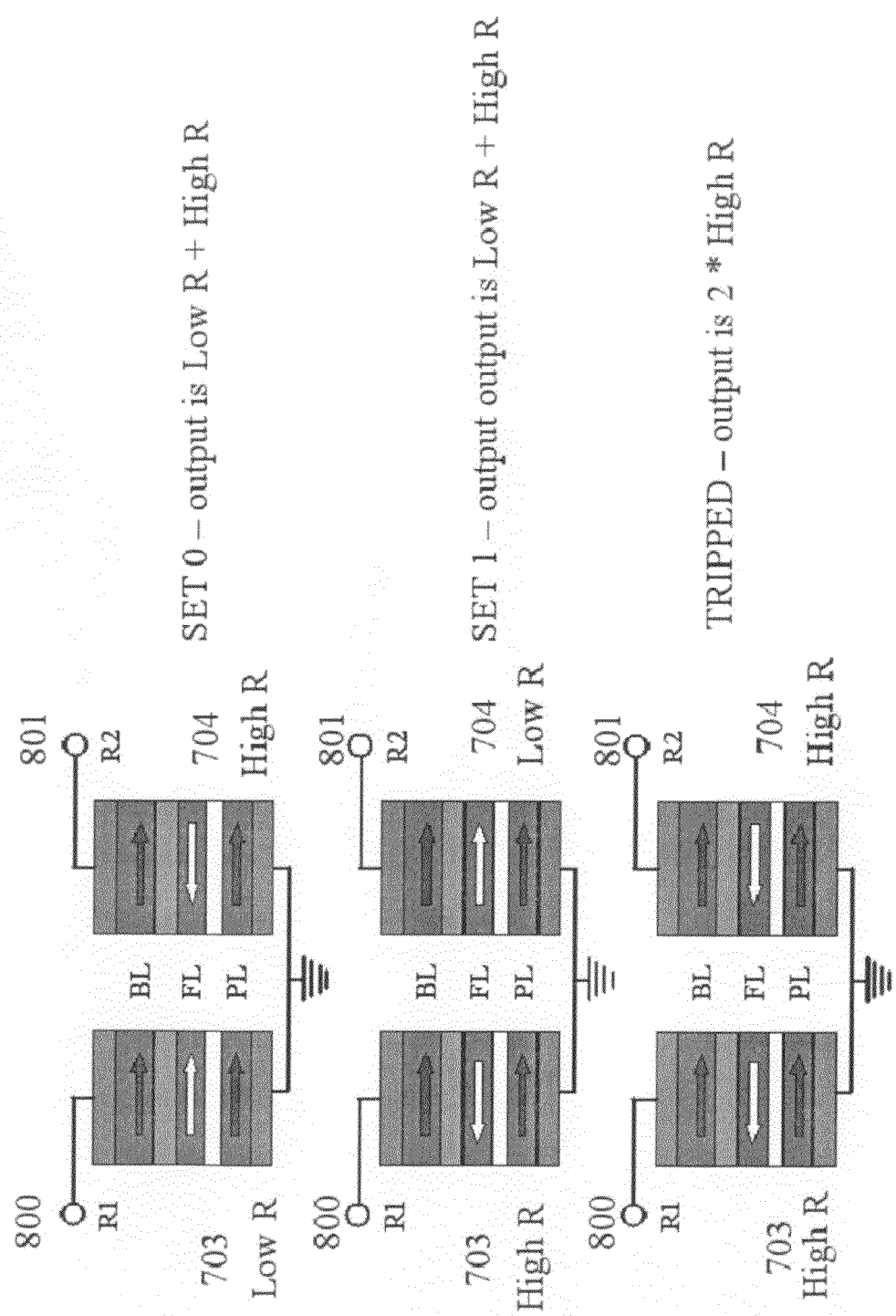
FIG. 8 shows cross-section views schematically representing the layers in LATSS elements in a selected interconnection arrangement.

The magnetic bias field axis can be set during device manufacture using on-chip magnets or hard magnetic layers or through the use of an electromagnet or permanent magnet that might be placed off-chip but in the vicinity of the LATSS device during use. A very simple means for providing a biasing field that is set during manufacture is through the use of controlled roughness of the pinned layer resulting in Néel coupling as described by equation 7. Additionally, bias layers as illustrated in FIG. 8 might be applied on top of, beneath, or adjacent to the LATSS elements an on the die during manufacture.

Stress on the LATSS die can be created by several means, including but not limited to curvature of the LATSS substrate, from strain due to mismatch between a seed layer and the materials in the SDT junction stack, through the use of a stressing layer above or below the stack. The stress of the LATSS device may be changed by changing the deformation of the LATSS substrate as shown in FIGS. 7, 10, 11, and 12. There are many mechanical means to induce curvature in the substrate that are obvious to those skilled in the art. In addition to mechanical means, other methods might include temperature induced strain through a large mismatch in thermal coefficient of expansion of the various materials in the device.

Table 2 below shows the flexibility in LATSS configurations that can be obtained by varying material properties, and orientation, of the various axes. The "$\lambda$" heading indicates the sign and magnitude of the magnetostriction constant of the LATSS element freelayer; the "init $\sigma$ orient" heading describes the orientation of the axis along which stress is applied relative to the magnetic easy-axis (EA) of the LATSS freelayer; the "Hcoup" heading refers to direction of the bias field with respect to the magnetic moment of the LATSS element, where ∥ means parallel to the remanent magnetic moment and AP means anti-parallel to the remanent magnetic moment; and the "stable $\sigma$" heading refers to the stress condition that produces a stable predetermined SET state. The parameter "$\sigma_c$" is the stress threshold for switching triggering the LATSS into the TAMPERED state as defined in equation 6. Violation of the "stable $\sigma$" condition irreversibly triggers the TAMPERED state.

TABLE 2

| $\lambda$ | init $\sigma$ orient | Hcoup | stable $\sigma$ |
|---|---|---|---|
| >0 | ∥ EA | ∥ Mrem | all |
| >0 | ∥ EA | AP Mrem | $\sigma < \sigma_c$ |
| >0 | ⊥ EA | ∥ Mrem | all |
| >0 | ⊥ EA | AP Mrem | $\sigma > -\sigma_c$ |
| >0 | none | ∥ Mrem | all |
| >0 | none | AP Mrem | $\sigma_x < \sigma_c, \sigma_y > -\sigma_c$ |
| <0 | ∥ EA | ∥ Mrem | all |
| <0 | ∥ EA | AP Mrem | $\sigma > -\sigma_c$ |
| <0 | ⊥ EA | ∥ Mrem | all |
| <0 | ⊥ EA | AP Mrem | $\sigma < \sigma_c$ |
| <0 | none | ∥ Mrem | all |
| <0 | none | AP Mrem | $\sigma_x > -\sigma_c, \sigma_y < \sigma_c$ |

Because the LATSS element freelayers are ferromagnetic, a magnetic field generated externally to the LATSS device could be applied to orient them into a desired state. This method could be used to reset a single LATSS element after it is tripped. In order to make this impossible, an array of LATSS elements is usually built onto the device substrate and configured so that they are written into opposing free layer magnetization direction states when the device is in the untampered or predetermined "SET" condition. Tampering would then be indicated when all elements in the LATSS array are written into the same free layer magnetization direction state from which they cannot all be returned to the initial SET state by an external magnetic field. This can be accomplished using the arrangement shown in FIG. 7. Here two LATSS elements 703 and 704 are set into opposing collinear orientations using an on-chip write conductor 700. The bits need not be perfectly collinear, and misalignment might be preferred for making the device harder to reset with an external field or for improving switching characteristics. Regardless of the deviation from perfect alignment, with respect to the programming conductor, current 705 through the programming conductor 700, produces opposing magnetic fields 701 at each of the LATSS elements that forces them to have their free layer magnetizations directed into the predetermined opposite directions SET state. Because the LATSS elements are so small and close together, it is impossible to generate an external magnetic field with sufficient gradient to trick the device into returning both to the "SET" state in which the free layer magnetizations of both LATSS elements are oppositely oriented. This can only be accomplished with establishing electrical current through programming conductor 700.

There are two additional benefits to using an array of LATSS elements for the device. First, the LATSS elements can each be used as a reference with respect to the other which provides the basis for a straightforward arrangement in providing operational temperature compensation. Second, they permit a tri-state operating mode that has two different acceptable predetermined "SET" conditions.

An arrangement for determining the magnetization states (or resistance states) of a series connected pair of LATSS elements is illustrated in FIG. 8. In FIG. 8, "BL" is a thick ferromagnetic bias layer used to offset the hysteresis loop of the "FL" or magnetostrictive free layer. "PL" is the pinned layer. Both the PL and BL magnetizations are fixed in orientation. The "SET 0" and "SET 1" states are the untampered states that are programmed using a programming conductor 700 arrangement like that shown in FIG. 7. In the "TAMPERED" state, the stress on the device causes the coercivity of the magnetostrictive FL layers to be less than the offset field produced by the BL layers. The FL layers are then forced to align parallel to the stray field produced by the BL layers. The tunnel barrier between the FL and PL layers dominates the resistance of the devices which is "R1" for LATSS element 703 and "R2" for LATSS 704. Thus, R1<R2 is SET0, R1>R2 is SET1, and R1=R2 indicates the TRIPPED or tampered state. The arrangement shown in FIG. 8 may be queried by measuring the resistance between connections 800 and 801. In this configuration, it is impossible to determine the difference between "SET0 and SET1", but both the SET states are different from the TRIPPED or tampered state. In both the SET0 and SET1 states, the resistance of the two LATSS element arrange would be R1+R2=High R+Low R. This indicates an untampered condition. When stress is removed from the LATSS substrate as would be expected to occur during tampering, the freelayer of both the 703 and 704 LATSS elements must orient to the left. Due to the stray field form the biasing layers. This produces an output R1+R2=2 (High R). This is higher than the resistance that occurs when both 703 and 704 are oriented in either the set 1 or set 0 condition, and it thus indicates a tamper event has occurred.

Figure 9:
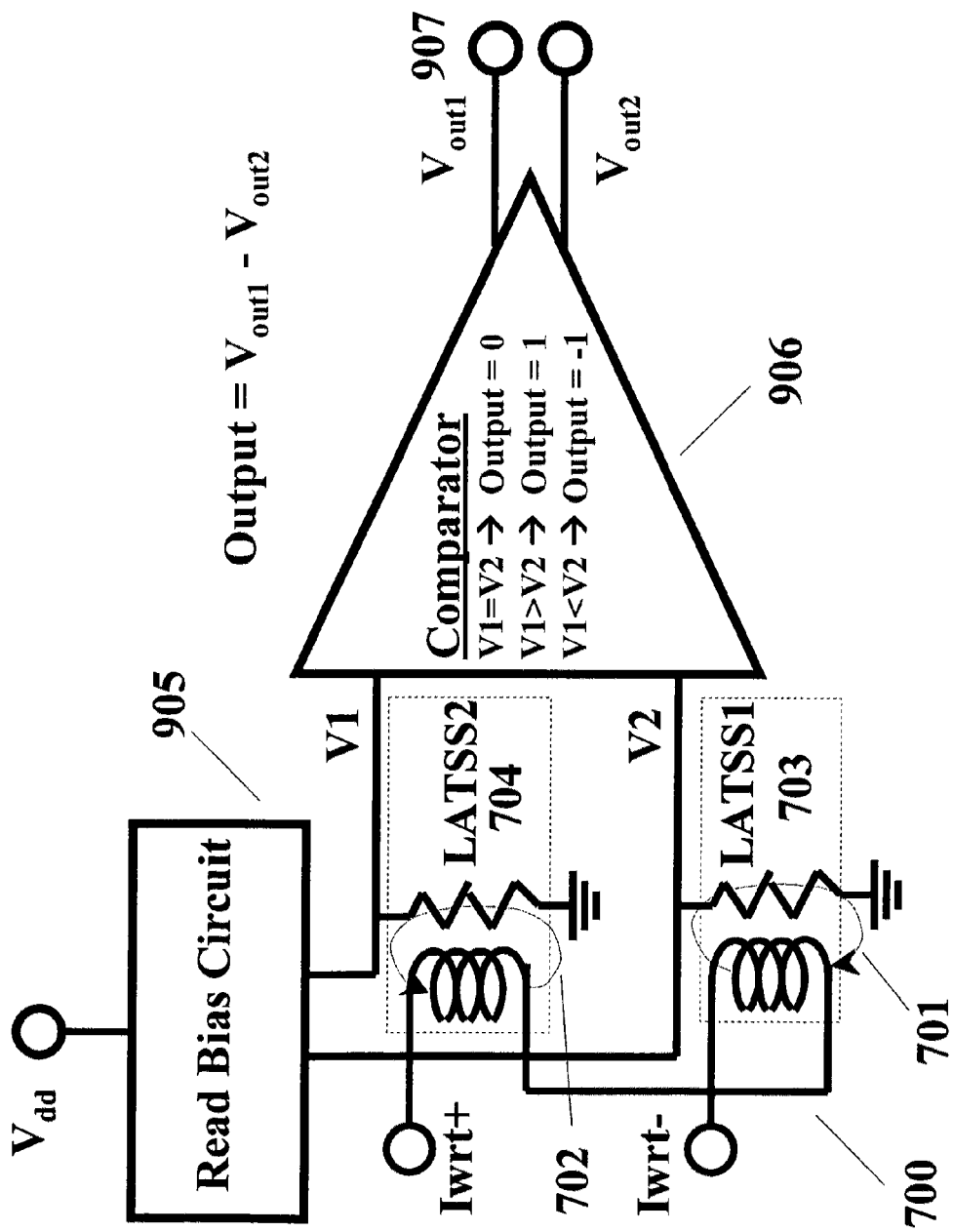
FIG. 9 shows a schematic diagram of an interconnection arrangement used for a two LATSS element device.

An alternative digital readout scheme utilizing two LATSS elements 703 and 704 that permits tri-state readout is indicated in FIG. 9, and summarized in Table 3. Here, two LATSS elements 703 and 704 are integrated with CMOS circuitry to allow their resistance values to be compared to each other thereby enabling a tri-state digital output. The purpose for doing this would be to make it less likely that a tamperer could restore the device to its original state after tripping the device. Again, programming conductor 700 has a geometry that produces opposing fields at each of the LATSS elements 703 and 704. This is used create a predetermined SET state with each of the LATSS elements 703 and 704 free layers having their magnetizations forced into opposite directions so that one LATSS element is always in a high resistance state while the other is in a low resistance state. The resistance of each LATSS element is determined by passing a current through the tunnel barrier and measuring the resulting voltage. The Read Bias Circuit 905 is used to source a small measurement basis electrical current though each of the LATSS elements 703 and 704. The resulting voltage produced at each LATSS elements 703 and 704 are compared in the comparator circuit 906.

The output of the device is then determined as indicated in Table 3.

TABLE 3

| Voltage measured at LATSS Elements | Output Value $V_{out}1 - V_{out}2$ | Comment |
| --- | --- | --- |
| V1 > V2 | 1 | Untampered - SET |
| V1 < V2 | −1 | Untampered - SET |
| V1 = V1 | 0 | TAMPERED |

The values "V1" and "V2" refer to the voltages generated across each LATSS element by the on-chip read bias circuit. The output refers to the output signal from the on-chip comparator.

Figure 10:
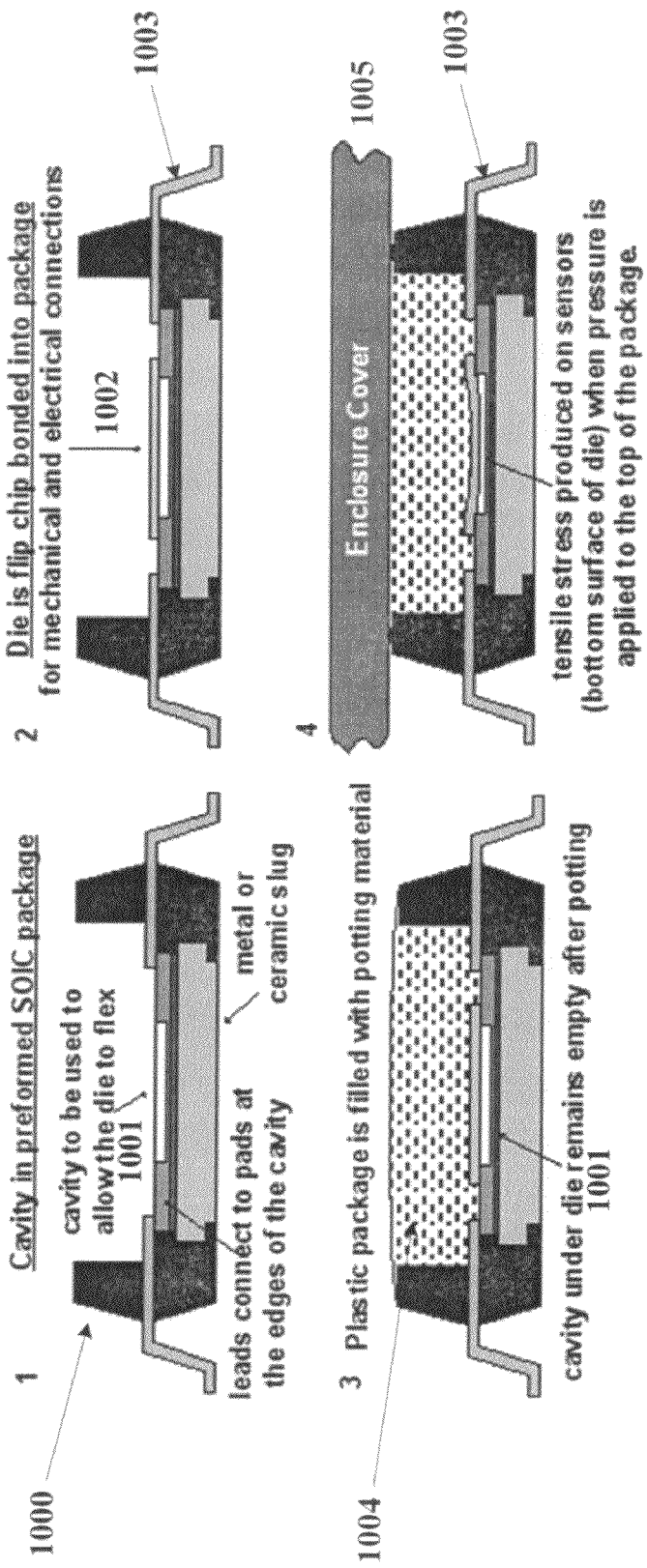
FIG. 10 shows a mechanical housing arrangement for use with LATSS elements.

The foregoing LATSS device can be configured for covert deployment by building them into standard DIP or SOIC packages, so they look like conventional circuit elements. Such a housing arrangement can be used to detect the removal of a lid as is illustrated in FIG. 10. The LATSS SOIC package is implemented and deployed as follows: (1) A preformed open-cavity package 1000 is made with an additional cavity 1001 under the position where the die 1002 will be attached. (2) The die 1002 is placed into the preformed SOIC package, and it is electrically connected to the lead frame 1003 by one of various techniques including but not limited to wire bonding or flip-chip bonding. (3) The preformed SOIC package is then potted with a plastic or epoxy material 1004. The potting material is sufficiently plastic that it transfers downward force from the top of the package to the LATSS die 1002. When pressure is applied to the LATSS package, for example using the enclosure cover 1005, the encapsulating material forces the LATSS die to bend into the cavity, producing stress on the LATSS elements that is far enough above the critical stress threshold that the LATSS device may be initialized into a predetermined SET state. Removal of the cover 1005 removes stress cause the LATSS die to pull out of the cavity 1001, relieving stress on the LATSS elements thereby forcing the LATSS device into the TRIPPED or tampered state.

Figure 11:
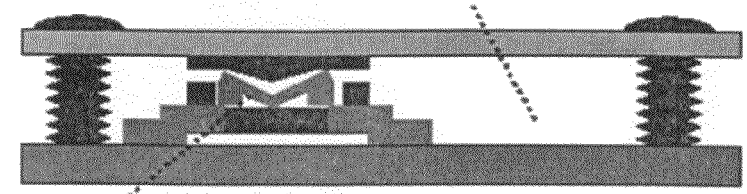
FIG. 11 shows a cutaway view schematically representing a mechanical housing arrangement for LATSS elements in a first condition.
Figure 12:
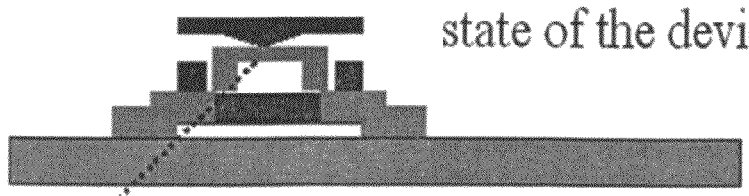
FIG. 12 shows a cutaway view schematically representing the mechanical housing arrangement of FIG. 11 in a second condition.

A covertly deployed LATSS device may be used to protect other devices provided in the vicinity of that LATSS device. A schematic housing illustration for such a covertly deployed LATSS device used to protect other components is shown in FIGS. 11 and 12 respectively. The protective LATSS devices in a SET state when lid 1005 is in place and trips into a TRIPPED or tampered state when that lid is removed. The LATSS device would be initialized into a SET state as follows:

1) Set the cover 1005 in place. The cover encloses other components that need to be protected 1130 in addition to the LATSS device and provides the stress on the die 1002 needed to produce the stable initial state in the LATSS.

2) Initialize the magnetization orientation of the sensors using current in the programming conductor 700 to set the individual LATSS elements into opposite states, i.e. one high resistance, the other low resistance. This is the "SET" condition.

3) If needed, burnout a fuse in the LATSS device so that it cannot be reprogrammed through programming conductor 700. The "fuse" could be implemented in various manners which depend on LATSS implementation. One such arrangement would be to design the write conductor 700 so that a portion of the write conductor 700 vaporizes during the initialization process. Thinning, or "necking down", a portion of 700 can accomplish this.

FIG. 12 shows the mechanical LATSS devices packaging arrangement of FIG. 11 with cover removed resulting in the LATSS switching into the TRIPPED state. Removal of the protective lid 1005 relieves mechanical stress on the die 1002. This can force LATSS element into a low resistance TRIPPED or tampered state through the process described in FIG. 6B. The LATSS device cannot be reset if a one-time-programmable technology, such as a fuse, is used in the programming circuit. There is probably no need to make a more complicated fusing mechanism for this type of single output LATSS device as it would be a more complicated procedure to defeat the LATSS fuse than finding other methods to invade the other protected components in the absence of a signal coding security arrangement. Thus, for improved security, several LATSS devices could be deployed, and the devices could be programmed into various states "1" or "0", that is, the collection of LATSS devices would store a code that would be difficult to reproduce.

Figure 13:
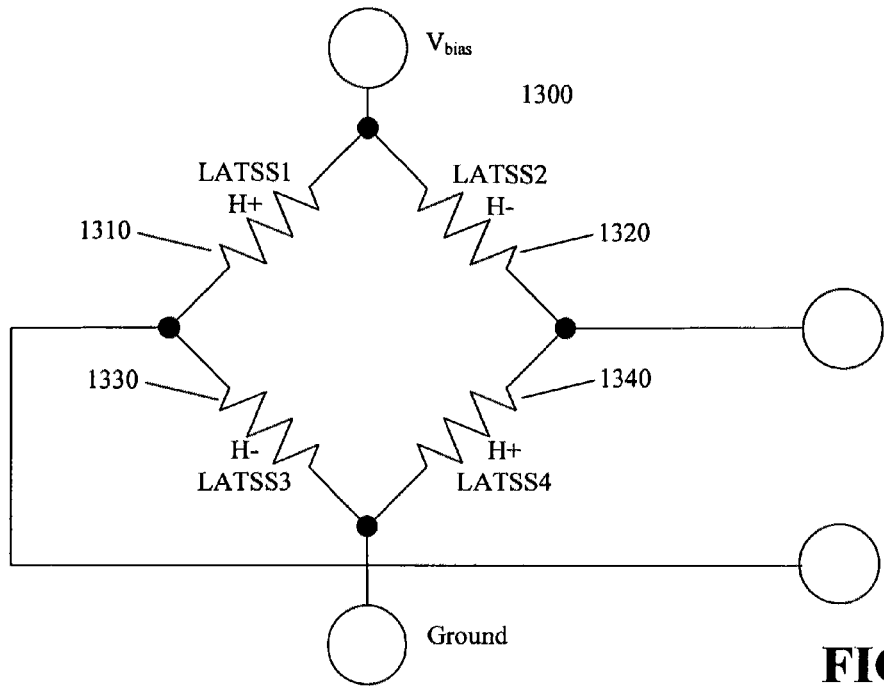
FIG. 13 shows a schematic diagram bridge circuit arrangement portion used with an analog circuit operated LATSS device.
Figure 14:
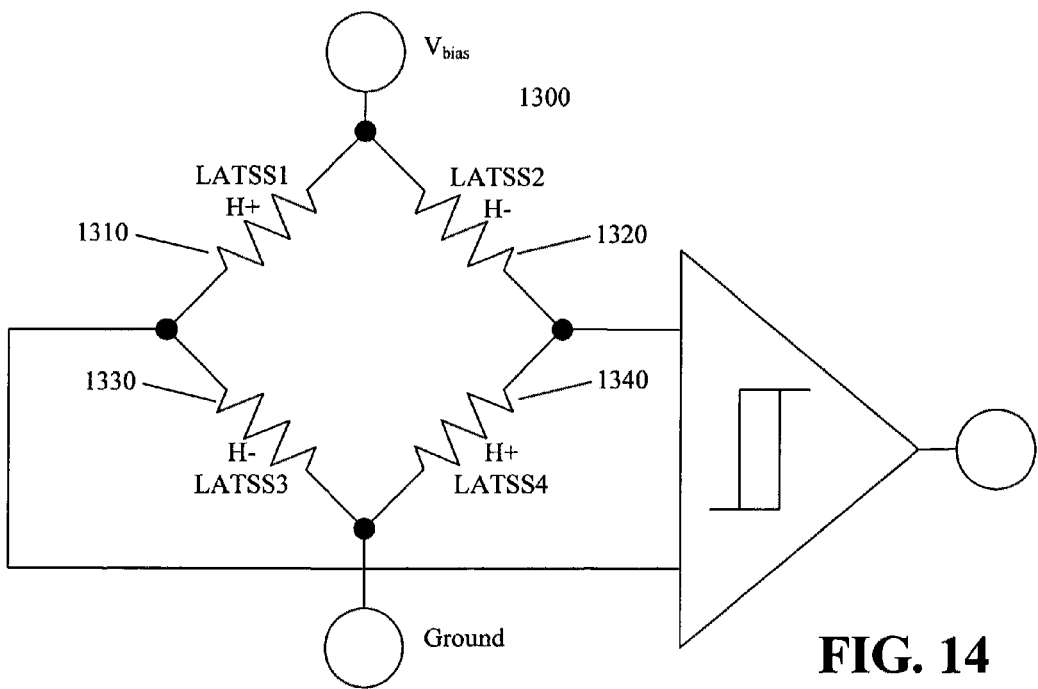
FIG. 14 shows a schematic diagram bridge circuit arrangement portion used with a digital circuit operated LATSS device.

For use as an analog tri-state tamper sensor or a more robust digital tamper sensor, an array of 4 or more LATSS elements may be combined into a Wheatstone bridge circuit as shown in FIGS. 13 through 15. This arrangement simplifies the electronic system design by increasing the size of the output signal relative to the background signal, and also by better compensating for noise and thermal drift. The output of the bridge circuit is more immune to damage from electrostatic discharge and thus would permit the LATSS output to be directly accessed to thereby eliminate the need for on-chip circuitry. The bridge circuit arrangement 1300 for an analog LATSS bridge is shown in FIG. 13 and the output thereof, as a function of the resistance values of the different LATSS elements 1310-1340, is given in Table 4. In the SET states, LATSS1 1310 and LATSS4 1340 must have the same resistance value, and LATSS2 1320 and LATSS3 1330 in those states must also have the same resistance. However, the LATSS pair 1320/1330 cannot have the same resistance value as the LATSS pair 1310/1340. The programming field polarity with respect to the program ming current required to achieve the SET state is indicated by the "H+" and "H−" labels in FIGS. 13 and 14. FIG. 14 shows a digital LATSS bridge that is formed by adding a comparator 1350 to the output of the bridge circuit.

Tampering is detected by the bridge circuit arrangement when the stress on the die changes beyond the critical stress $\sigma_c$, then, all LATTS elements 1310, 1320. 1330, and 1340 will be forced into the same resistance state producing the TRIPPED or tampered output value. The output state as a function of the LATSS element resistances is summarized in Table 4 for the bridge circuit. The columns in the table are headed as follows: "Set I" is the polarity of the programming or set current; "Tamper" indicates whether or not a change in substrate stress large enough to trip the LATSS elements into a low resistance (L) or high resistance (H) state has occurred; "1" through "4" indicates the resistance of the LATSS elements as labeled in FIGS. 14 and 14 after programming or after a tamper event; "analog Output" is the value of V1-V2 in FIG. 13; and digital output is the three state output from the comparator 1360 in FIG. 14.

TABLE 4

| Set I | Tamper | 1 | 2 | 3 | 4 | Analog Output | Digital Output Value | Tamper |
|---|---|---|---|---|---|---|---|---|
| + | No | $R_L$ | $R_H$ | $R_H$ | $R_L$ | $\frac{R_H^2 - R_L^2}{(R_L + R_H)^2} V_{bias}$ | 1 | 0 |
| − | No | $R_H$ | $R_L$ | $R_L$ | $R_H$ | $\frac{R_L^2 - R_H^2}{(R_L + R_H)^2} V_{bias}$ | 0 | 0 |
| Don't Care | Yes | $R_H$ | $R_H$ | $R_H$ | $R_H$ | ~0 | Don't Care | 1 |
| Don't Care | Yes | $R_L$ | $R_L$ | $R_L$ | $R_L$ | ~0 | Don't Care | 1 |

Figure 15A:
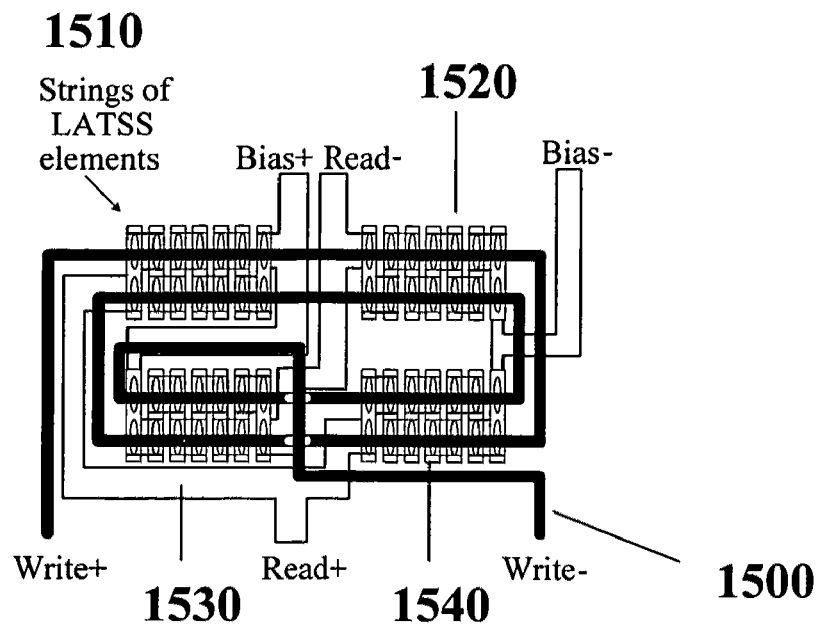
FIGS. 15A and 15B show a circuit schematic diagram and a corresponding die layout used with analog circuit operated LATSS device arrangement comprising series connected LATSS elements.
Figure 15B:
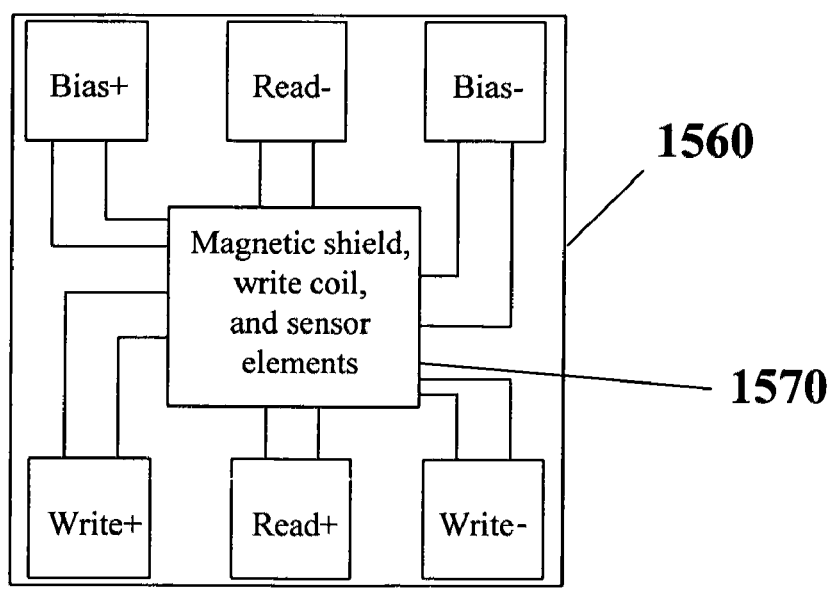

FIG. 15A shows the layout for a LATSS device utilizing a bridge circuit where each leg in the bridge circuit is a series connected string of LATSS elements. The sensor legs 1510, 1520, 1530, and 1540 are interconnected as shown in FIGS. 13 and 14, and they are each composed of strings of 2 or more individual LATSS elements electrically connected together in series. This is used to decrease the voltage drop across each tunnel junction and, in addition, for use in averaging random defect dependent switching characteristics. A programming conductor 1500 is wrapped into a spiral coil in order to produce the programming field polarities as given in FIGS. 13 and 14. FIG. 15B shows the layout of a corresponding LATSS die 1560 with an integrated magnetic shield 1570 used to shield the LATSS sensors form ambient magnetic fields.

Figure 16:
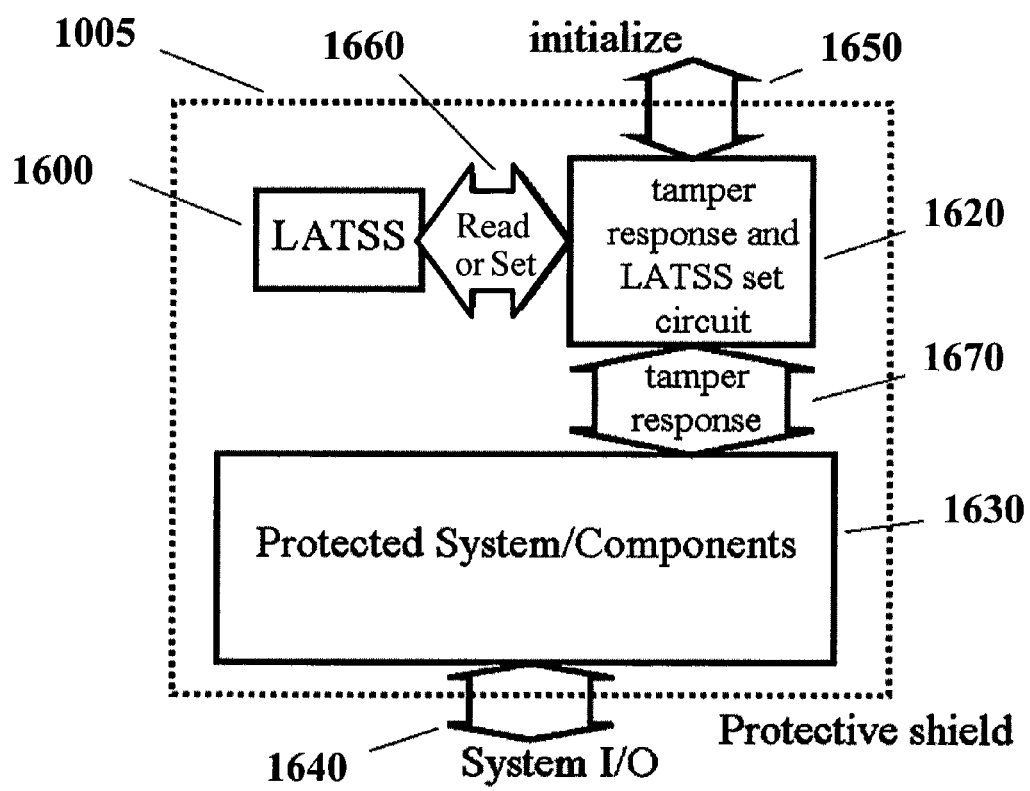
FIG. 16 shows a schematic representation of LATSS memory device arrangement to protect an electronic circuits system.

One way for protecting a system using a LATSS configured as an anti-tamper sensor is shown in FIG. 16. Here a LATSS device 1600 protects the system components located under shield 1005. A tamper response and LATSS set circuit 1620 is used to initialize the LATSS device through a tamper/set bus 1660 and also to monitor the device status through the tamper/set bus 1660. The tamper response and LATSS set circuit 1620 are configured to set the LATSS device based on an input line 1650. Circuit 1620 can also interface with the protected system/components 1630 through a tamper response bus 1670. The communication between tamper response and LATSS set circuit 1620 and the protected system/components 1630 to permit the system data to be cleared or to produce some other reset or self-destruct response in order to protect information stored within the protected system/components 1630 block. The protected system/components 1630 is capable of communicating with another system that is external to the protective shield 1005, through a system I/O bus 1640.

Figure 17:
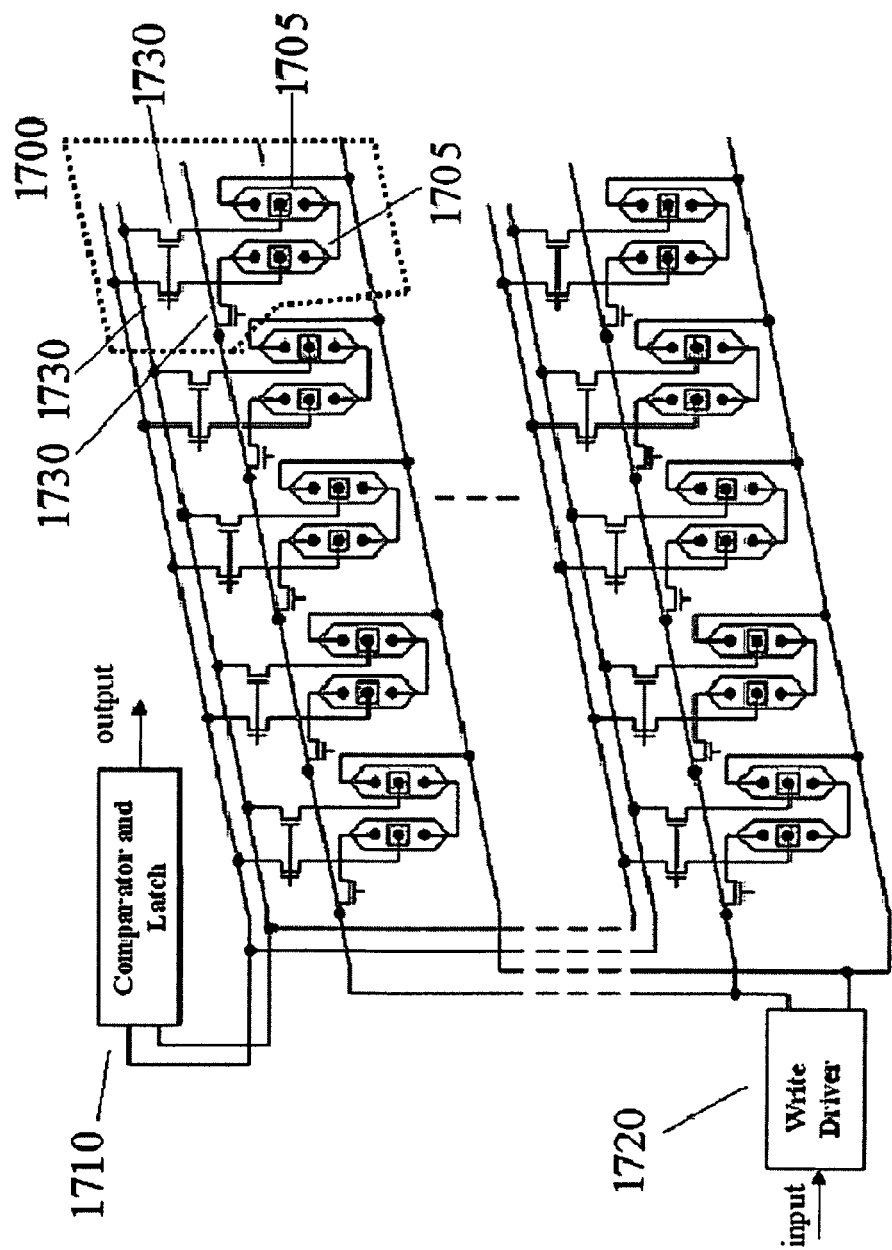
FIG. 17 shows a schematic representation of interconnected devices in a system arrangement embodying the present invention.

LATSS based anti-tamper security may be further improved by configuring an assembly of LATSS elements as a memory device. This provides a memory device that has the capability to respond to a tampering event. The response would be destruction of data stored within the LATSS memory device. One possible means for producing a LATSS memory is shown in FIG. 17. Here, a two element LATSS memory element 1700 is composed of three select MOS transistors 1730 and two LATSS elements 1705 that are written into opposing states. This arrangement is often referred to as a 3 transistor, 2 magnetic tunnel junction (3T2MTJ) bit cell. Each 3T2MTJ cell is operated a manner analogous to the operation of the 2-element LATSS described in FIG. 9. The select transistors 1730 are used to permit the read and write operation of individual LATSS memory cells within the memory array. These 3T2MTJ LATSS memory cells may be combined with readout circuitry 1710 similar to the comparator shown in FIG. 9 capable of determining the three state response of the memory element 1700, and write circuitry 1720 for producing the current used to program the LATSS elements 1705. Addressing circuitry, not shown in FIG. 17, is used to control the state of the select transistors to select a particular 3T2MTJ LATSS element for reading or writing.

Figure 18:
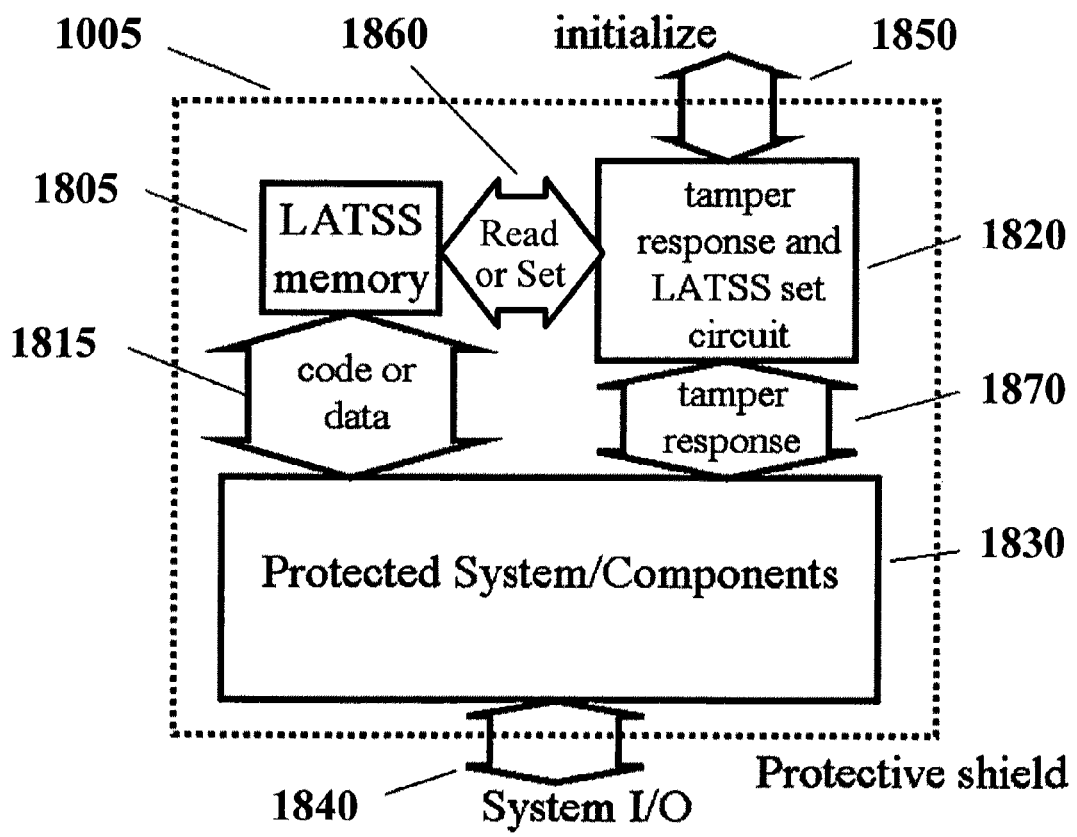
FIG. 18 shows a schematic representation of an LATSS memory device arrangement to protect an electronic circuits system.

Another way for protecting a system using a LATSS configured as an anti-tamper memory is shown in FIG. 18. Here, a LATSS memory device 1805 protects a system or components located under protective cover 1005. A tamper response and LATSS set circuit 1820 is used to initialize the LATSS memory device 1805 through a read/set bus 1860. The tamper response and LATSS set circuit 1820 may be configured to program a code into the LATSS device based on an input line 1850. This code remains intact until tampering that is removal of 1005 occurs. The communication between tamper response and LATSS set circuit 1820 and the protected system/components 1830 is to permit the system data within the protected system block 1830 to be cleared or to produce some other reset or self-destruct response. Alternatively, the protected system block 1830 may interface directly with the LATSS memory device 1805 through a data bus 1815. In this case, the LATSS memory may be used to hold encryption keys used for encrypting data within the protected system block 1830, or the LATSS memory may hold sensitive runtime or other data that needs to be destroyed in the event of a tamper. When sensitive data or keys are stored within the LATSS memory 1805, the tamper event destroys them thereby disabling the system and rendering it difficult to reverse engineer. The protected system/components 1830 may or may not communicate with another system that is external to the protective cover 1005, through a system I/O bus 1840.

Although the present invention has been described with reference to preferred embodiments, workers skilled in the art will recognize that changes may be made in form and detail without departing from the spirit and scope of the invention.

The invention claimed is:

1. A tamper sensing system mounted with respect to a protected structure so as to have corresponding stress changes occur therein in response to selected kinds of tamperings with said protected structure, said system comprising:

a first pair of stress affected magnetoresistive memory devices each capable of having a magnetic material layer therein established in a selected one of a pair of alternative magnetization states if in a first kind of stress condition and of being established in a remaining magnetization state if in an alternative second kind of stress condition and with said magnetic material layer in each having a magnetization in a first direction in one of said pair of alternative magnetization states and in a second direction in that remaining one of said pair of magnetization states, said first pair of stress affected magnetoresistive memory devices being mounted together such that at least one of said first and second directions thereof at least in part parallels an aligning direction that parallels at least in part at least one of said first and second directions of that other one remaining; and a first magnetizing electrical conductor extending adjacent to each of said first pair of stress affected magnetoresistive memory devices such that providing an electrical current therethrough to generate a corresponding magnetic field thereabout establishes said magnetic material layer of each of said first pair of stress affected magnetoresistive memory devices in that one of said pair of alternative magnetization states thereof so as to have said magnetization corresponding thereto be oppositely directed with respect to said magnetization of that other magnetic material layer insofar as components thereof substantially parallel to said aligning direction when each of said first pair of stress affected magnetoresistive memory devices is provided with a first kind of stress condition.

2. The system of claim 1 further comprising a pair of electrodes on opposite ends of each of said first pair of stress affected magnetoresistive memory devices with said first pair of stress affected magnetoresistive memory devices electrically connected in series to one another at an electrode of each and at a remaining electrode of one to a series devices electrical resistance determiner.

3. The system of claim 1 further comprising a pair of electrodes on opposite ends of each of said first pair of stress affected magnetoresistive memory devices with said first pair of stress affected magnetoresistive memory devices each electrically connected to one another at an electrode of each and at a remaining electrode of each to a device electrical resistance determiner.

4. The system of claim 1 further comprising each of said first pair of stress affected magnetoresistive memory devices being provided by a spin dependent tunneling device having differing numbers of magnetization states available thereto depending on whether being in differing ones of alternative stress conditions, said spin dependent tunneling device comprising:
an electrically insulative material intermediate layer, said intermediate layer having two major surfaces on opposite sides thereof;
a magnetization reference layer on one of said intermediate layer major surfaces, said magnetization reference layer having a relatively fixed direction of magnetization; and
a memory film of an a magnetostrictive, anisotropic ferromagnetic material on that remaining one of said intermediate layer major surfaces having a magnetization directed at an angle with respect to said relatively fixed direction due to an effective magnetic bias field being present to result in said device having an electrical resistance versus applied external magnetic field characteristic in a first kind of stress conditions with unequal coercivities for external magnetic fields applied in opposite directions, said magnetostrictive, anisotropic ferromagnetic material being such that said device in one kind of stress conditions has a coercivity with a magnitude exceeding that of said effective magnetic bias field and in another kind of stress conditions has a coercivity with a magnitude less than that of said effective magnetic bias field.

5. The system of claim 1 further comprising:
a second pair of stress affected magnetoresistive memory devices each capable of having a magnetic material layer therein established in a selected one of a pair of alternative magnetization states if in a first kind of stress condition and of being established in a remaining magnetization state if in an alternative second kind of stress condition and with said magnetic material layer in each having a magnetization in a first direction in one of said pair of alternative magnetization states and in a second direction in that remaining one of said pair of magnetization states, said second pair of stress affected magnetoresistive memory devices being mounted together such that at least one of said first and second directions thereof at least in part parallels an aligning direction that parallels at least in part at least one of said first and second directions of that other one remaining; and
a second magnetizing electrical conductor extending adjacent to each of said first pair of stress affected magnetoresistive memory devices such that providing an electrical current therethrough to generate a corresponding magnetic field thereabout establishes said magnetic material layer of each of said second pair of stress affected magnetoresistive memory devices, provided with a first kind of stress condition, in that one of said pair of alternative magnetization states thereof so as to have its said corresponding magnetization be oppositely directed with respect to said magnetization of that other insofar as components thereof substantially parallel to said aligning direction.

6. The system of claim 5 further comprising a pair of electrodes on opposite ends of each of said first pair of stress affected magnetoresistive memory devices and a pair of electrodes on opposite ends of each of said second pair of stress affected magnetoresistive memory devices with said first pair of stress affected magnetoresistive memory devices electrically connected together at a junction to be further electrically connected in series between first and second termination regions suited for electrical connection to a source of electrical energization and with said second pair of stress affected magnetoresistive memory devices electrically connected together at a junction to be further electrically connected in series between said first and second termination regions, there further being a voltage difference sensor electrically connected between said junctions.

7. The system of claim 1 further comprising said first magnetizing electrical conductor having therein a fusing arrangement such that providing an electrical current therethrough to generate a corresponding magnetic field about said first pair of stress affected magnetoresistive memory devices to establish in said magnetic material layer of each one of said pair of alternative magnetization states thereof causes said fusing arrangement to subsequently to interrupt said electrical current and prevent reestablishing thereafter further electrical current in said first magnetizing electrical conductor.

8. The system of claim 1 wherein said magnetic material layer in said first pair of stress affected magnetoresistive memory devices is of a magnetostrictive material and positioned in a bias magnetic field.

9. The system of claim 1 further comprising said first pair of stress affected magnetoresistive memory devices being positioned in a housing with a housing structure portion forced thereagainst sufficiently to establish each in said first kind of stress condition.

10. The system of claim 9 wherein reducing said housing structure portion force against said first pair of stress affected magnetoresistive memory devices sufficiently establishes them in said second kind of stress condition.

11. The system of claim 10 further comprising said housing having an electronic information storage system having information stored therein that is positioned in said housing electrically coupled to said first pair of stress affected magnetoresistive memory devices such that said first pair of stress affected magnetoresistive memory devices being changed from said first kind of stress condition to said second kind of stress condition results in a change in said information stored in said electronic information storage system.

12. The system of claim 3 further comprising said first pair of stress affected magnetoresistive memory devices having said electrodes where electrically connected to one another being together electrically connected to a first termination region suited for electrical connection to a source of electrical energization and said first pair of stress affected magnetoresistive memory devices each being further electrically connected through a corresponding device selection transistor to said device electrical resistance determiner which is electrically connected to a second termination regions suited for electrical connection to said source of electrical energization.

13. The system of claim 12 wherein said first magnetizing electrical conductor is electrically connected in series with a corresponding magnetization selection transistor between first and second termination regions suited for electrical connection to a source of electrical energization.

14. The system of claim 4 wherein said magnetization reference layer of one of said first pair of stress affected magnetoresistive memory spin dependent tunneling devices is electrically connected to said memory film of that remaining one of one of said first pair of stress affected magnetoresistive memory spin dependent tunneling devices with a selected one of that remaining said magnetization reference layer and said memory film being electrically connected to a series devices electrical resistance determiner.

15. The system of claim 4 wherein said magnetization reference layers of said first pair of stress affected magnetoresistive memory spin dependent tunneling devices form a reference layer pair and said memory films of said first pair of stress affected magnetoresistive memory spin dependent tunneling devices form a memory layer pair and further comprising a selected one of said reference and memory layer pairs being electrically connected to a first termination region suited for electrical connection to a source of electrical energization and that remaining pair being electrically connected through a corresponding device selection transistor to a device electrical resistance determiner which is electrically connected to a second termination regions suited for electrical connection to said source of electrical energization.

16. The system of claim 15 wherein said first magnetizing electrical conductor is electrically connected in series with a corresponding magnetization selection transistor between first and second termination regions suited for electrical connection to a source of electrical energization.

17. The system of claim 5 further comprising one of said first pair of stress affected magnetoresistive memory devices and one of said second pair of stress affected magnetoresistive memory devices being electrically connected together at a junction as a first series pair with electrodes on opposite ends thereof to have said first series pair electrically connected in series between first and second termination regions suited for electrical connection to a source of electrical energization with said first series pair of memory devices each having said first direction thereof being a common direction, and with that remaining one of said first pair of stress affected magnetoresistive memory devices and that remaining one of said second pair of stress affected magnetoresistive memory devices being electrically connected together at a junction as a second series pair with electrodes on opposite ends thereof to have said second series pair electrically connected in series between said first and second termination regions with said second series pair of memory devices each having said first direction thereof being a common direction.

18. The system of claim 5 further comprising one of said first pair of stress affected magnetoresistive memory devices and one of said second pair of stress affected magnetoresistive memory devices being electrically connected together at a junction as a first series pair with a termination electrode and a sense junction electrode on opposite ends thereof to have said first series pair termination electrode electrically connected to a first termination region suited for electrical connection to a source of electrical energization with said first series pair of memory devices each having said first direction thereof being a common direction, and with that remaining one of said first pair of stress affected magnetoresistive memory devices and that remaining one of said second pair of stress affected magnetoresistive memory devices being electrically connected together at a junction as a second series pair with a sense junction electrode and a termination electrode on opposite ends thereof to have said second series pair termination electrode electrically connected to said second termination regions with said second series pair of memory devices each having said first direction thereof being a common direction, said first and second series pairs sense electrodes being electrically connected to one another.

19. The system of claim 5 further comprising a pair of electrodes on opposite ends of each of said first pair of stress affected magnetoresistive memory devices which are electrically connected to one another at an electrode of each and electrically connected to a first termination region suited for electrical connection to a source of electrical energization with said first pair of stress affected magnetoresistive memory devices each being further electrically connected through a corresponding device selection transistor to a device electrical resistance determiner which is electrically connected to a second termination regions suited for electrical connection to said source of electrical energization, and a pair of electrodes on opposite ends of each of said second pair of stress affected magnetoresistive memory devices which are electrically connected to one another at an electrode of each and electrically connected to said first termination region suited for electrical connection to a source of electrical energization with said second pair of stress affected magnetoresistive memory devices each being further electrically connected through a corresponding device selection transistor to said device electrical resistance determiner which is electrically connected to a second termination regions suited for electrical connection to said source of electrical energization, said first and second pairs of stress affected magnetoresistive memory devices being positioned in a housing with a housing structure portion forced thereagainst sufficiently to establish each in said first kind of stress condition such that reducing said housing structure portion force against said first and second pairs of stress affected magnetoresistive memory devices sufficiently establishes them in said second kind of stress condition, said housing having an electronic information storage system having information stored therein that is positioned in said housing electrically coupled to said first and second pairs of stress affected magnetoresistive memory devices so that coding key information stored in said first and second pairs of stress affected magnetoresistive memory devices must be used by said electronic information storage system to obtain information stored therein such that said first and second pairs of stress affected magnetoresistive memory devices being changed from said first kind of stress condition to said second kind of stress condition results in a change in said coding key information stored therein.

* * * * *